United States Patent [19]
Hollander et al.

[11] Patent Number: 5,293,349
[45] Date of Patent: Mar. 8, 1994

[54] MEMORY CELL CIRCUITS, DEVICES, SYSTEMS AND METHODS OF OPERATION

[75] Inventors: James F. Hollander, Dallas; William R. Krenik, Garland; Louis J. Izzi, Plano, all of Tex.

[73] Assignee: Texas Instruments Incorporated, Dallas, Tex.

[21] Appl. No.: 720,099

[22] Filed: Jun. 24, 1991

[51] Int. Cl.$^5$ .................. G11C 8/00; G11C 11/34; G06F 15/00; H01L 27/11
[52] U.S. Cl. .................. 365/230.05; 365/154; 365/182; 365/188; 365/190; 364/754; 257/903; 257/904
[58] Field of Search ........... 365/154, 174, 182, 188, 365/190, 230.05; 364/521, 518, 754; 257/903, 904

[56] References Cited

U.S. PATENT DOCUMENTS

| 4,660,177 | 4/1987 | O'Connor | 365/230.05 |
| 4,723,226 | 2/1988 | McDonough et al. | 365/230.02 |
| 4,933,899 | 6/1990 | Gibbs | 365/230.05 |
| 4,984,204 | 1/1991 | Sato et al. | 365/230.05 |
| 5,068,830 | 11/1991 | Plants et al. | 365/190 |

FOREIGN PATENT DOCUMENTS

| 54-144834 | 11/1979 | Japan | 365/230.05 |
| 57-60586 | 4/1982 | Japan | 365/190 |
| 60-136085 | 7/1985 | Japan | 365/190 |
| 61-68794 | 4/1986 | Japan | 365/230.05 |
| 1-264690 | 10/1989 | Japan | 365/230.05 |
| 2-89288 | 3/1990 | Japan | 365/230.05 |
| 3-29187 | 2/1991 | Japan | 365/230.05 |

OTHER PUBLICATIONS

IEEE Journal of Solid State Circuits, vol. SC-22, No. 5, Oct., 1987, "The Twin-Port Memory Cell", O'Connor, P,712-P,720.

Primary Examiner—Rolf Hille
Assistant Examiner—Steven Loke
Attorney, Agent, or Firm—J. P. Violette; James F. Hollander; Richard L. Donaldson

[57] ABSTRACT

A memory cell constructed in accordance with the present invention includes a node operable to present an electrical level representing a first state or a second state. Further included is a first switching device having a first terminal connected to the node such that if the first switching device were to close, the electrical level at the node would be connected to a second terminal of the first switching device. Additionally, second and third switching devices are provided both having first and second terminals and both operable to switch as a function of the state at the node. Finally, a single control switching device is provided in association with the second and third switching devices wherein a control signal switches the control switching device such that the state at the node may be determined by connecting to the first terminals of the second and third switching devices.

61 Claims, 9 Drawing Sheets

MEMORY CELL CIRCUITS, DEVICES, SYSTEMS AND METHODS OF OPERATION

NOTICE (C) Copyright, *M* Texas Instruments Incorporated 1991. A portion of the disclosure of this patent document contains material which is subject to copyright and mask work protection. The copyright and mask works owner has no objection to the facsimile reproduction by anyone of the patent document or the patent disclosure, as it appears in the Patent and Trademark Office patent file or records, but otherwise reserves all copyright and mask work rights whatsoever.

TECHNICAL FIELD OF THE INVENTION

This invention relates to integrated circuits, and more particularly to an improved memory cell which may be used according to improved methods in numerous devices and systems such as contemporary video systems.

BACKGROUND OF THE INVENTION

In modern digital applications, various requirements and constraints are imposed on memory cell designers. Often, the more important considerations depend on the particular application in which the memory cells are being used. For example, in some instances it is highly desirable to minimize the number of devices implemented per memory cell, thereby consuming less surface area on an integrated circuit and, hence, increasing packing density. Another typical constraint is the speed of the memory cell and, thus, considerations of resistance and capacitance are heavily emphasized. Still another concern is memory cell load and power consumption. One increasingly important consideration for memory design is the need to provide multiple access or multiple ports to a single memory cell. These multiple ports permit simultaneous access through each port to the data stored in the cell. Thus, if two or more different devices may require access to a particular memory cell at a given point in time, it is consequently desirable to provide two or more ports to provide access to the data or state of the cell.

One previous effort to provide multi-port access to memory cells requires at least two switching transistors per port terminal in order to provide access to the memory cell. Thus, in addition to the various devices including transistors making up the cell, a pair of transistors for each port terminal are required. Thus, where a dual port cell is created having two terminals per port, a total of four terminals are needed and, hence, eight (i.e. four terminals each requiring two transistors) transistors are required in order to provide access to the cell. In addition, some attempts to provide multi-port access to a memory cell create a significant load on the cell itself. As a result, power consumption for the cell is increased as is the access and delay time associated with the cell. Consequently, an increased number of ports creates a significant trade-off in both power consumption and cell speed.

Therefore, a need has arisen for an improved multi-port memory cell configuration which optimizes the various concerns discussed above when one or more of the constratints usually assumed and described above are traded off with each other.

SUMMARY OF THE INVENTION

In accordance with the present invention, a memory cell structure, methodology and system are provided which substantially eliminate or reduce disadvantages and problems associated with prior memory cell configurations.

A memory cell constructed in accordance with the present invention includes a node operable to present an electrical level representing a first state or a second state. Further included is a first switching device having a first terminal connected to the node such that if the first switching device were to close, the electrical level at the node would be connected to a second terminal of the first switching device. Additionally, second and third switching devices are provided both having first and second terminals and both operable to switch as a function of the state at the node. Finally, a single control switching device is provided in association with the second and third switching devices wherein a control signal switches the control switching device such that the state at the node may be determined by connecting to the first terminals of the second and third switching devices.

The present invention provides numerous technical advantages over the prior art. For example, several embodiments provide additional memory ports wherein each port requires only one control switching device. Another technical advantage is that additional ports are each connected to a node via a significantly high impedance thereby ensuring that the load on the node is minimized. As a result, there is an additional technical advantage of reduced power consumption and reduced load on the node. Still another technical advantage is that the numerous embodiments herein may be combined in various combinations in order to optimize cell layout and utilization of transistors under contemporary large scale integration design.

Other memory cells, devices, systems and methods are also disclosed and claimed herein and have various of these and other technical advantages.

DETAILED DESCRIPTION OF THE INVENTION

Figure 1:
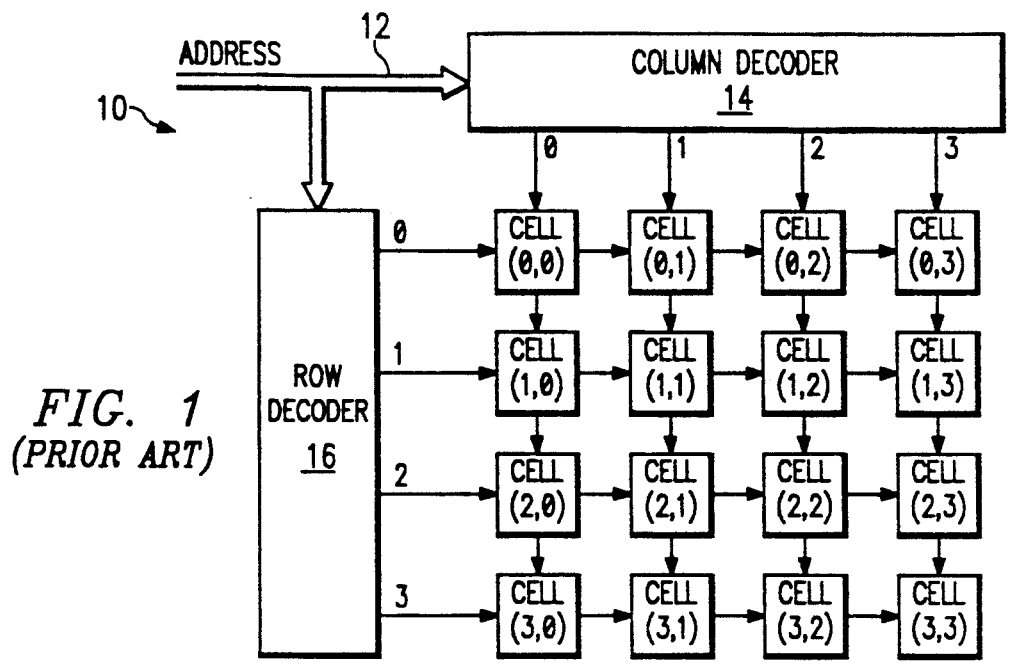
FIG. 1 illustrates a prior memory system including an array of memory cells arranged in a row by column fashion.

FIG. 1 illustrates a typical prior art memory system denoted generally at 10. Memory system 10 includes an array of memory cells organized in a row by column fashion. Thus, each memory cell is illustrated as including a parenthetical identifier which indicates the location of a memory cell by its row and column. For example, the memory cell identified by (0,2) is located in row 0 and column 2. The remaining cells are similarly identified. Memory system 10 further includes an address bus 12 which communicates with a column decoder 14 and a row decoder 16. Address bus 12 receives an address from any one of various digital devices such as a microprocessor or a DMA controller. The address is reduced to an independent row and independent column address. The row address is connected to row decoder 16 while the column address is connected to column decoder 14. Both decoders 14 and 16 access the particular cell within the array of cells, the accessed cell being identified by the specific address.

Upon accessing the cell, data is either written to, or read from, the specifically addressed cell. For binary applications, this data is referred to as a "bit", and is represented as a logic "0" or "1". Further, the bit stored in the cell is described as the "state" of the cell. Some memory cells provide differential output signal pairs which define a port to access the data in the cell. In this instance, each column includes dual lines to sense the relative voltage between these differential outputs. The state of the cell is then determined from the value of the differential voltage between the pair of outputs. Additional pull-up voltages may also be used as known in the art to determine the state of a cell. In all cases, this decoding process may continue to either read data from, or write data to, other cells within the array.

Figure 2A:
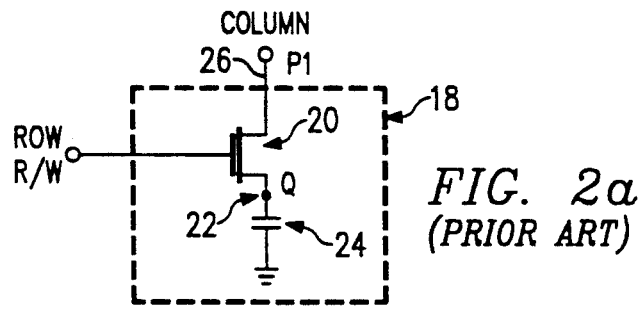
FIG. 2a illustrates a prior art dynamic random access memory cell.

FIG. 2a illustrates a single port memory cell 18 which may be used within the array of cells shown in FIG. 1. In particular, memory cell 18 is a dynamic random access memory (DRAM) cell. A DRAM is so named because the storage of information within the cell is dynamic and, therefore, must be continuously refreshed in order to maintain the data within the cell. In particular, memory cell 18 includes a transistor 20 connected via a node 22 to a capacitor 24. Transistor 20 is illustrated by example as an n channel transistor. Capacitor 24 is further connected to ground. Capacitor 24 may be either charged or discharged, thereby representing two possible states for memory cell 18. Either state is detectable by sensing the electrical level, Q, at node 22.

The operation of cell 18 is as follows. The gate of transistor 20 connects to a row line coming from row decoder 16 shown in FIG. 1. In particular, a read/write signal (illustrated as R/W) is communicated along a specific row line to memory cell 18. This signal causes transistor 20 to conduct, thereby coupling node 22 to column output 26. As a result, the electrical level, Q, which represents the state of cell 18 and which is stored at node 22 is detectable through transistor 20 at column output 26. Thus, column output 26 provides a single port terminal, P1, providing access to the state of cell 18 as reflected at node 22.

Figure 2B:
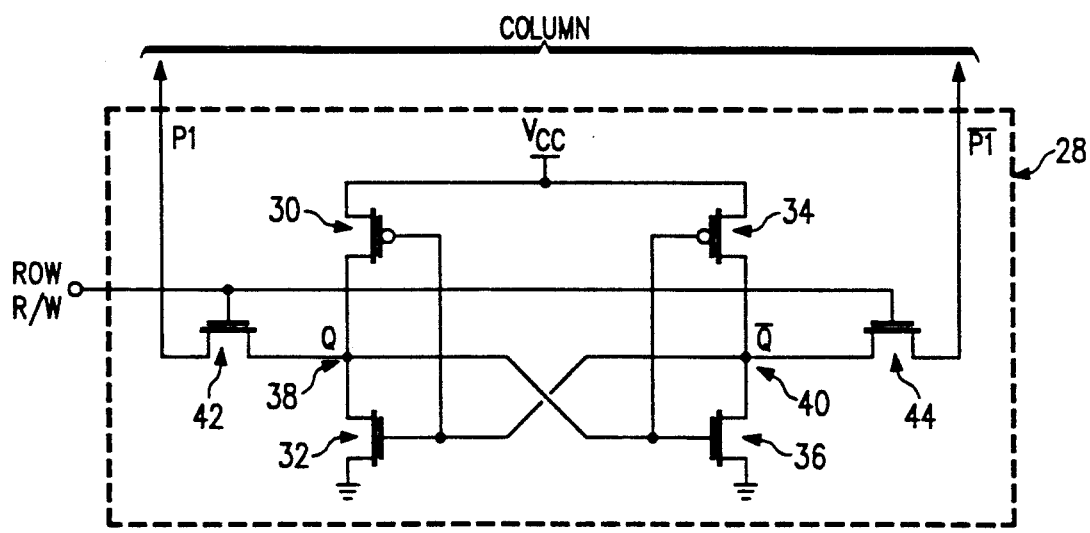
FIG. 2b illustrates a prior art static random access memory cell.

FIG. 2b illustrates an alternative single port memory cell 28 which may be implemented within the array of cells illustrated in FIG. 1. In particular, memory cell 28 is known in the art as a static random access memory (SRAM). The SRAM is so named because the information stored within the memory cell is static and, therefore, need only be established once and need not be refreshed. SRAM cell 28 provides a single port having complementary terminals P1 and $\overline{P1}$ in order to read/write data from/to the cell.

Memory cell 28 includes a first pair of transistors 30 and 32 and a second pair of transistors 34 and 36. The sources of transistors 30 and 32 are connected at an output node 38 which bears an electrical level, Q. Similarly, the sources of transistors 34 and 36 are connected at an inverted output node 40. As its name suggests, inverted output node 40 bears an inverted, or complementary, electrical level, $\overline{Q}$. The drains of transistors 30 and 34 are connected to a power supply voltage, $V_{cc}$. The drains of transistors 32 and 36 are connected to ground. Transistor 30 is a p channel transistor while transistor 32 is an n channel transistor. Similarly, transistor 34 is a p channel transistor while transistor 36 is an n channel transistor.

The first pair of transistors 30 and 32 are connected to form an inverter configuration. In particular, the gates of transistors 30 and 32 are connected to one another. Thus, it may be appreciated that a high input signal to these connected gates will result in a low signal Q at output node 38. This low signal occurs because transistor 32 is conducting while transistor 30 is not and, hence, output node 38 is connected to ground through transistor 32. In opposite fashion, if a low signal appeared at the connected gates of transistors 30 and 32, a high signal would appear at output 38. This high signal occurs because the low signal at the connected gates of the first pair of transistors 30 and 32 causes transistor 30 to conduct while transistor 32 remains off. The conduction of transistor 30 couples output node 38 to the power supply voltage, $V_{cc}$, and therefore creates a high signal at output node 38. It should be further appreciated that the second pair of transistors 34 and 36 are also connected in an inverter fashion and, therefore, the signal $\bar{Q}$ at inverted output node 40 will represent the inverse of a signal at the connected gates of transistors 34 and 36.

The "static" operation of memory cell 28 is as follows. The inverters created by transistors 30 and 32 and 34 and 36 are connected in a fashion called cross-coupling. In particular, output node 38 of the inverter configuration created by transistors 30 and 32 is connected to the input of the inverter created by of transistors 34 and 36. Similarly, the output 40 of transistors 34 and 36 is connected to the input or gates of transistors 30 and 32. This cross-coupling ensures that when one pair of transistors is in a first conductive state, the opposing pair of transistors will be in the opposite state. For example, if output node 38 is at a high electrical level, this high electrical level is connected to the gates of transistors 34 and 36, thereby causing transistor 36 to conduct while transistor 34 remains off. As a result, output node 40 is at a low state due to the conduction of transistor 36. This low state at output node 40 is further connected to the gates of transistors 30 and 32, thereby causing transistor 30 to conduct while transistor 32 remains off. As a result, output 38 remains high due to the conduction of transistor 30. Thus, it may be appreciated that the cross-coupling maintains output node 38 at an electrical level which is the complement or opposite of the electrical level at inverted output node 40. Naturally, the converse operation is also true for memory cell 28 when output node 38 carries a low signal and inverted output node 40 carries a high signal. Memory cell 28 further includes a pair of read/write switching transistors 42 and 44. The gates of read/write transistors 42 and 44 are connected to one another and are also connected to receive an activation R/W signal from row decoder 16 illustrated in FIG. 1. A first source/drain of transistor 42 is connected to output node 38 while a second source/drain of transistor 42 is connected to port terminal P1. Terminal P1 is connected to column decoder 14. Similarly, a first source/drain of transistor 44 is connected to inverted output node 40 while a second source/drain of transistor 44 is connected to an inverted port terminal, $\overline{P1}$. Terminal $\overline{P1}$ is also connected to column decoder 14. Thus, it may be appreciated that row decoder 16 can place a high signal at the gates of transistors 42 and 44, thereby causing them to turn on. As a result, the electrical levels Q and $\bar{Q}$ at output nodes 38 and 40 will be conducted through transistors 42 and 44, respectively, to terminals P1 and $\overline{P1}$ and also to the column decoding circuit 14. A separate sense amplifier is typically provided which may then sense the differential voltage between terminals P1 and $\overline{P1}$ in order to read the state of memory cell 28. Alternatively, the state of memory cell 28 may be changed by activating transistors 42 and 44 in this manner and applying a predetermined potential to either terminal P1 or $\overline{P1}$.

From the above, it may be appreciated that memory cells 18 and 28 illustrated in FIGS. 2a and 2b both demonstrate a mechanism for storing a data bit, and for providing access to that stored data bit through a single memory port. The memory port may include either a single, or dual terminals. The remaining illustrations and discussions herein teach a plurality of embodiments by which multiple port access may be made to a memory cell, thereby providing the improved advantage of having more than one port to access the data in the memory cell while providing additional advantages which will become apparent below.

Figure 3:
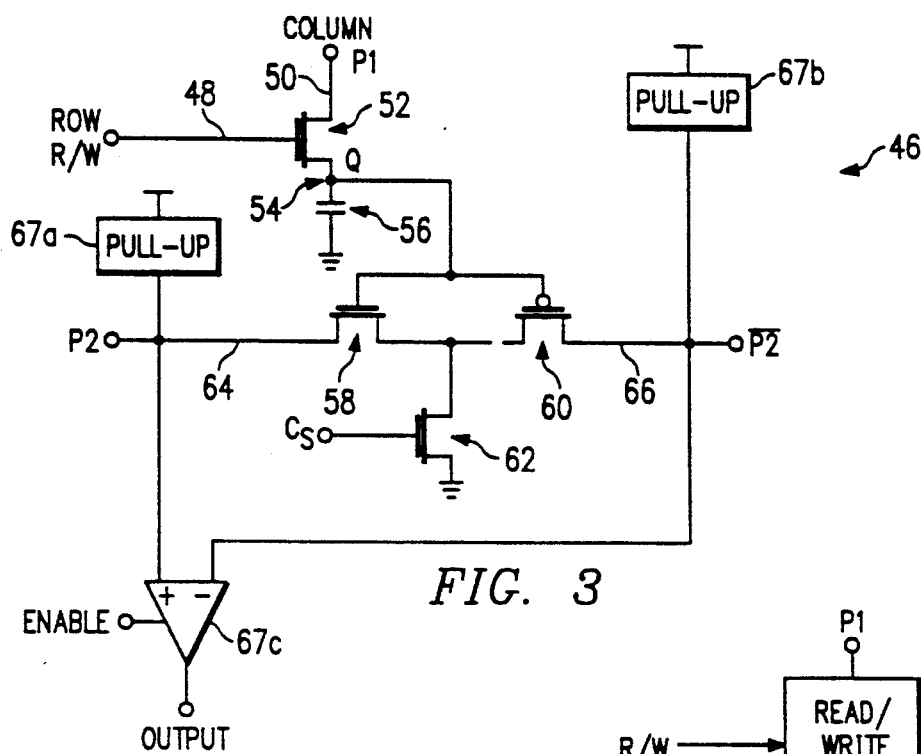
FIG. 3 illustrates a dual port memory cell having a second port controlled by the state at an output node of a DRAM cell.

FIG. 3 illustrates a schematic of a first embodiment of an improved multi-port memory cell 46. Memory cell 46 includes a row input 48 and a first port terminal, P1. Input 48 is connected to the gate of a transistor 52 having its first source/drain 50 connected to port terminal P1 and its second source/drain connected to output node 54. A capacitor 56 is connected between output node 54 and ground. Thus, it may be appreciated that the connection of transistor 52 and capacitor 56 is the same as that described as DRAM memory cell 18 discussed in connection with FIG. 2a, above. The remaining componentry illustrated in FIG. 3, however, provides a second port of access to the data stored by memory cell 46.

The second port of access may be made by contacting second port terminals P2 and $\overline{P2}$. These terminals provide complementary signals and are derived as follows. Output node 54 is connected to the gates of a pair of transistors 58 and 60. Transistor 58 is an n channel transistor while transistor 60 is a p channel transistor. A single control transistor 62 is connected to a first source/drain of both transistors 58 and 60. The second source/drain 64 of transistor 58 is connected to a second port terminal P2 while a second source/drain 66 of transistor 60 is connected to an inverted second port terminal $\overline{P2}$. The drain of single control transistor 62 is connected to ground while the gate is operable to receive a control signal, $C_S$.

The operation of multi-port memory cell 46 is as follows. When memory cell 46 is one state, a low electrical level, Q, is stored at output node 54. This first state may be detected through first column port 50 as discussed in the manner in connection with FIG. 2a, above. This low state may be detected also through the second port defined between terminals P2 and $\overline{P2}$. In particular, the low electrical level at output node 54 will cause transistor 60 to conduct while transistor 58 will not. In order to access the state of the memory cell through the second port, a control signal, $C_S$, is connected to control transistor 62. In the instance when output node 54 is low and the control signal, $C_S$, is connected to transistor 62, inverted second port terminal $\overline{P2}$ will be connected through conducting transistor 60 to ground. Oppositely, however, transistor 58 will not conduct and, therefore, second port terminal P2 will float at a voltage higher than the ground potential connected to inverted second port terminal $\overline{P2}$. As a result, port terminal P2 will be at a higher potential than port terminal $\overline{P2}$, thereby representing one state for the memory cell. This particular voltage difference may be sensed using pull-up circuits 67a and 67b, and a sense amplifier 67c. It should be noted that the pull-up circuits and sense amplifier circuitry are not illustrated in many of the remaining drawings for purposes of clarity.

From the above, it may be appreciated that the state at output node 54 will control the relative potentials at port terminals P2 and $\overline{P2}$. In the opposite example, when output node 54 is at a high potential, transistor 58 will conduct while transistor 60 will not. In order to read the second port, control signal $C_S$ is enabled causing transistor 62 to conduct. Because transistor 58 is conducting and transistor 60 is not, port terminal P2 is connected through transistors 58 and 62 to ground while inverted port terminal $\overline{P2}$ is pulled up by pull-up circuit 67b. Thus, in this opposite instance, the potential at terminal $\overline{P2}$ will be higher than that of terminal P2, thereby indicating the second state for memory cell 46.

It should be noted that the circuitry including transistors 58, 60 and 62 provide a significantly low load on output node 54. This phenomenon occurs because transistor 58 and 60 are connected to output node 54 through their gates, and these gates have significantly high input impedances. As a result, the load at output node 54 caused by the second port is substantially low. This low load creates several advantages such as low power consumption, low parasitic effects and the ability to add additional port circuits of the same configuration without a deleterious effect on the remaining components or signals associated with node 54.

For illustrative purposes, memory cell 46 is further illustrated as including pull-up circuits 67a and 67b connected to port terminals P2 and $\overline{P2}$, respectively. As discussed above, these circuits permit the respective terminals to be pulled up to a predetermined voltage in accordance with known principles. A sense amplifier 67c is also connected to terminals P2 and $\overline{P2}$ in order to evaluate the differential voltage between them. Sense amplifier 67c receives an enable signal and produces an output signal corresponding to the relative potentials at terminals P2 and $\overline{P2}$. Pull-up circuits 67a and 67b, as well as sense amplifier 67c, may be included with each of the embodiments discussed herein to facilitate reading of the state of each memory cell.

Figure 4:
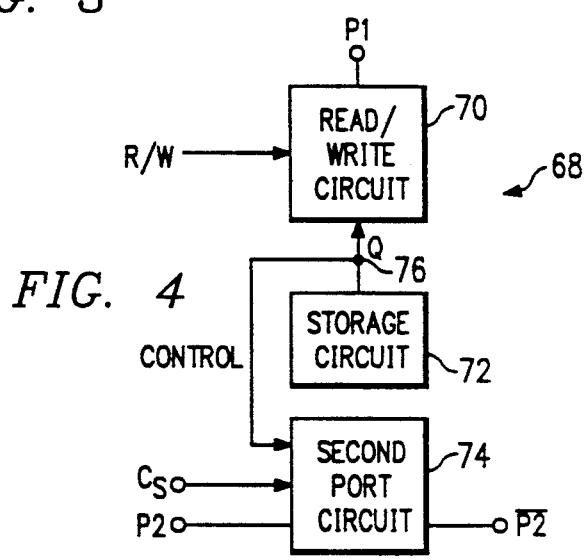
FIG. 4 illustrates a block diagram of a dual port memory cell.

FIG. 4 illustrates a block diagram of a dual port memory cell designated at 68. In particular, dual port memory cell 68 includes a read/write circuit 70, a storage circuit 72 and a second port circuit 74. Read/write circuit 70 receives either a read or write input signal denoted R/W. During the writing mode, the R/W signal permits the writing of data through read/write circuit 70 to storage circuit 72 and, as a result, an electrical level, Q, will be stored at an output node 76. During the reading mode, a signal at the R/W input of read/write circuit 70 permits electrical level Q, stored at output node 76 to be read from a first port terminal, P1.

The electrical level at output node 76 further operates to partially control second port circuit 74. In other words, the operation of second port circuit 74 is a function of the electrical level at output node 76. In particular, the electrical level at output node 76 operates to cause second port circuit 74 to also switch between a first and second state. In order to read the first or second state of second port circuit 74, a control signal $C_S$ is input to circuit 74 and the state of circuit 74 is determined at the second port terminals P2 and $\overline{P2}$. Thus, from FIG. 4, it may be appreciated that the changing of state or the specific state of storage circuit 72 not only is determinable through the first port P1, but also directly affects, and is determinable through, the state of operation of second port circuit 74. As a result, a dual terminal second port is provided in order to determine the state of storage circuit 72 while minimizing the load on that storage circuit. It should be appreciated that various circuitry could be used for any of blocks 70, 72 and 74.

Figure 5:
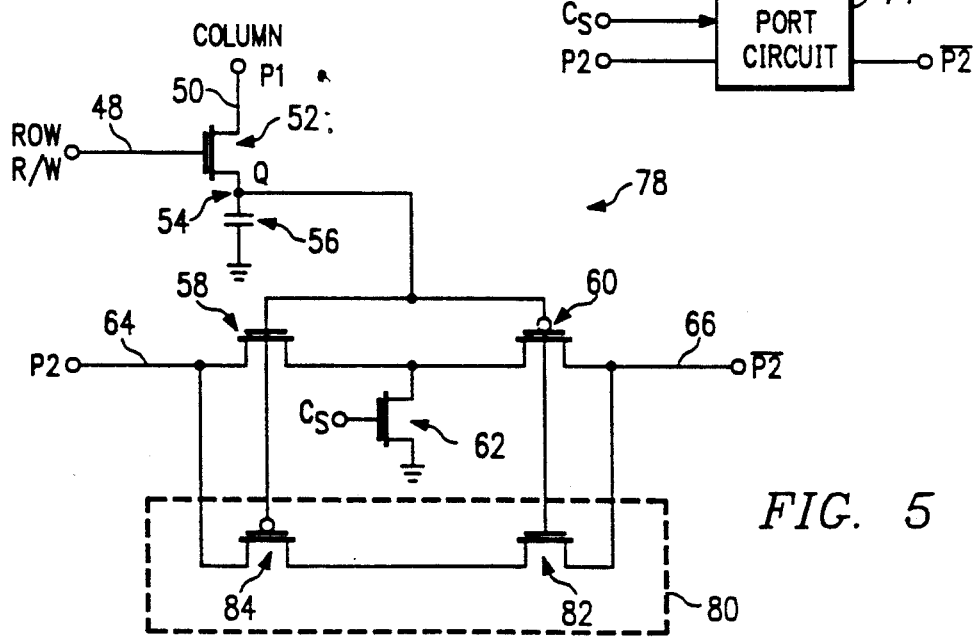
FIG. 5 illustrates the memory cell of FIG. 3 with the addition of a balancing circuit.

FIG. 5 illustrates a balanced memory cell 78. Memory cell 78 includes the schematic components as that of memory cell 46 shown in FIG. 3 with the addition of a balancing circuit 80. In the embodiment of FIG. 5, balancing circuit 80 includes an n channel transistor 82 and a p channel transistor 84. A first source/drain of p channel transistor 84 is connected to second port terminal P2 while a first source/drain of n channel transistor 82 is connected to inverted second port terminal $\overline{P2}$. The gates of both p channel transistor 84 and n channel transistor 82 are connected to output node 54. The second source/drains of n channel transistor 82 and p channel transistor 84 are connected to one another.

Balancing circuit 80 operates in a fashion to balance the conductive states and impedances of transistors 58 and 60. In particular, because all four transistors 58, 60, 82 and 84 are connected to output node 54, the conductivity of each of these transistors depends on the electrical level stored at output 54. Thus, when output node 54 is high, transistors 58 and 82 will conduct while transistors 60 and 84 will not. Oppositely, when output node 54 is low, transistors 60 and 84 will conduct while transistors 58 and 82 will not. This opposite conductivity type of transistors gives rise to a balancing effect in the overall operation and accessibility of data through second port terminals P2 and $\overline{P2}$.

The balancing effect of circuit 80 arises from the electrical capacitive symmetry created by the circuit. Without the symmetry, the parasitic capacitance introduced by transistors 58 and 60 is asymmetric with respect to terminals P2 and $\overline{P2}$. In particular, depending on which of transistors 58 and 60 is on, a larger parasitic capacitance would be introduced by transistor 58 or 60 to one of the two terminals P2 or $\overline{P2}$. The symmetry added by balancing circuit 80, however, balances the gate-to-drain and gate-to-source parasitic capacitances regardless of the electrical level at node 54. Thus, during high speed applications, balancing circuit 80 permits access of the state at node 54 very quickly irrespective of whether that state is low or high. Additionally, the balancing effect reduces noise and common mode interference, as well as improving the differential sensing function which may be applied to terminals P2 and $\overline{P2}$. It should be noted, however, that in a memory array where bitline capacitance is relatively large compared to that of a particular cell, balancing circuit 80 may be omitted. However, for low bitline capacitances and/or high speed applications, balancing circuit 80 provides advantageous results.

Figure 6:
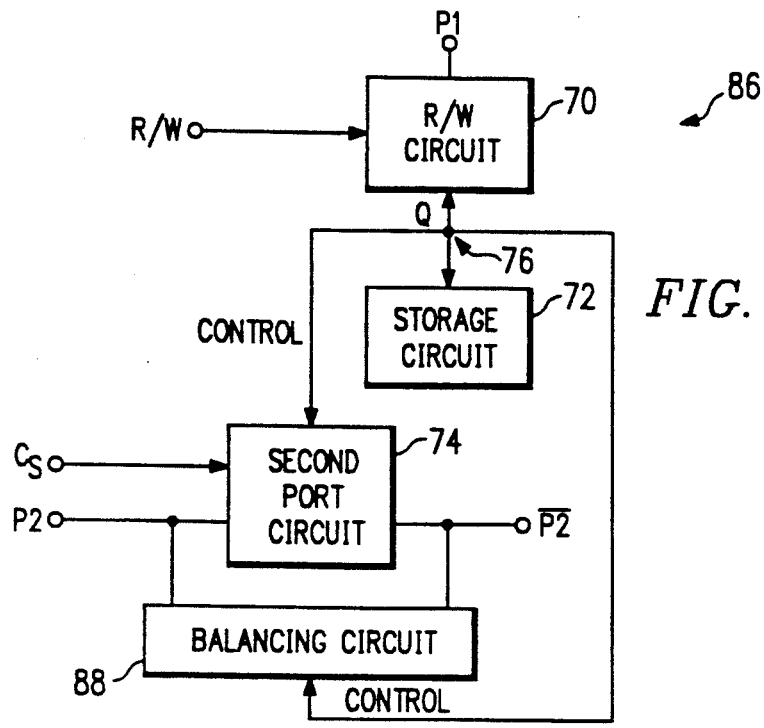
FIG. 6 illustrates a block diagram of a dual port memory cell having a balancing circuit.

FIG. 6 illustrates a block diagram of a balanced memory cell 86. Balanced memory cell 86 includes the same block components of dual port memory cell 60 shown in FIG. 4, with the addition of a balancing circuit 88. Thus, balanced memory cell 86 includes a read/write circuit 70, a storage circuit 72 and a second port circuit 74. Read/write circuit 70 receives a read/write (R/W) signal so that information may be either read from, or written to, storage circuit 72. As a result, storage circuit 72 provides an electrical level, Q, to output node 76 and which represents the information stored by circuit 72. This state of information may be read through read/write circuit 70 to the first port P1, or alternatively, through the second port circuit having terminals P2 and $\overline{P2}$. The electrical level Q at output node 76 controls the state of second port circuit 74 and also the operation of balancing circuit 88. Thus, as the operation of second port circuit 74 occurs, balancing circuit 88 provides a symmetric function so that the various circuit parameters such as impedances and parasitic capacitances are substantially balanced. Again, this balancing creates equal access times at the second port regardless of whether the state at output node 76 is high or low.

Figure 7:
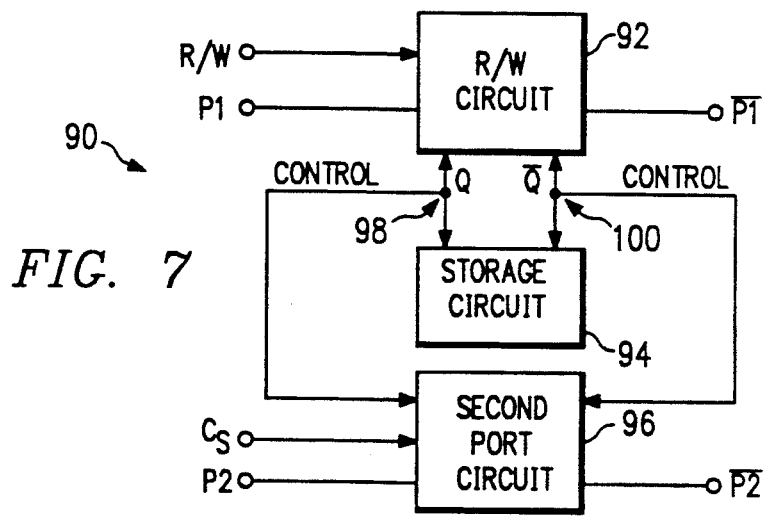
FIG. 7 illustrates a dual port memory cell wherein the storage circuit has complementary outputs.

FIG. 7 illustrates a block diagram of an alternative embodiment of a memory cell 90. Memory cell 90 includes a read/write circuit 92, a dual output storage circuit 94, and a second port circuit 96. Read/write circuit 92 receives a read/write (R/W) signal in order to either read from, or write to, dual output storage circuit 94. When data is written through read/write circuit 92 to dual output storage circuit 94, that data is stored at output node 98 and inverted output node 100 (illustrated as complementary electrical level signals denoted Q and $\overline{Q}$).

Memory cell 90 includes two separate dual ports in order to read the information or determine the state at output node 98 and inverted output node 100. The first port includes terminals P1 and $\overline{P1}$ and is accessible through read/write circuit 92. In particular, this port is read by enabling the read/write signal and sensing the differential voltages at P1 and $\overline{P1}$. The second port includes terminals P2 and $\overline{P2}$ from second port circuit 96. This second port is read by applying a control signal, $C_S$, to second port circuit 96 and sensing the differential voltages at P2 and $\overline{P2}$. The respective electrical levels at output node 98 and inverted output node 100 directly control the state of second port circuit 96. Thus, the output determined from the second port terminals P2 and $\overline{P2}$ is a function of the electrical level stored at output nodes 98 and 100. As a result, second port circuit 96 provides an alternative port in order to access or determine the state of storage circuit 94 as reflected at output nodes 98 and 100. Thus, from FIG. 7, it may be appreciated that any dual output storage circuit 94 may be used in order to provide two nodes for access to the data stored within the storage circuit. Various examples of particular schematics are disclosed below which illustrate some of the many configurations which may typify the block diagram of memory cell 90.

Figure 8:
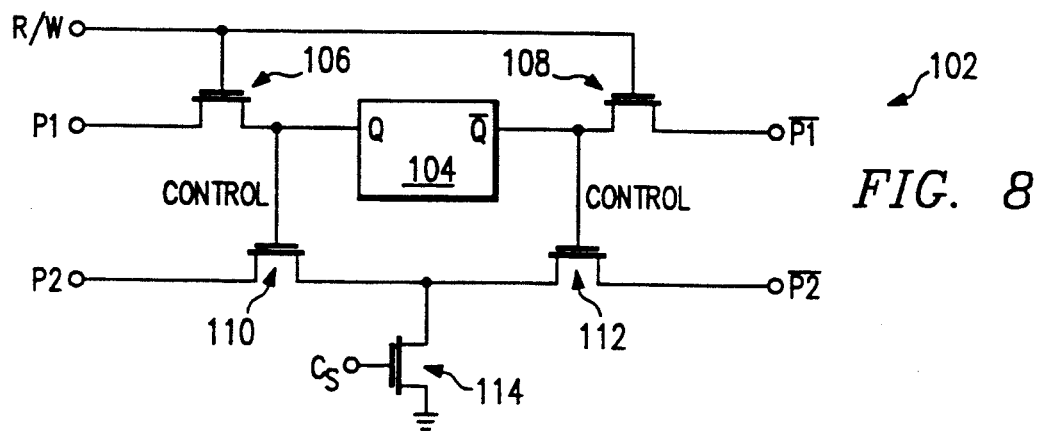
FIG. 8 illustrates a schematic embodiment of an exemplary circuit for the block diagram of FIG. 7.

FIG. 8 illustrates a first embodiment 102 constructed in accordance with the principles set forth in connection with the block diagram of FIG. 7. Cell 102 includes a dual output storage element 104. Dual output storage element 104 may comprise a flip-flop or other two state dual output device as may be contemplated or developed by one skilled in the art. Memory cell 102 further includes a first pair of transistors 106 and 108. Transistors 106 and 108 are n channel transistors, but may alternatively be p channel transistors receiving an active low signal. The gates of transistors 106 and 108 are connected to receive the read/write signal. A first source/drain of both transistors 106 and 108 are connected to the output and inverted output (denoted Q and $\overline{Q}$) of dual output storage element 104, respectively. The second source/drains of transistors 106 and 108 provide respective complementary output signals at terminals P1 and $\overline{P1}$. These signals provide a first port of access to the information stored within dual output storage element 104.

Memory cell 102 further includes a second pair of transistors 110 and 112. Transistors 110 and 112 are of the same conductivity-type and, hence, may both be either p or n channel. Transistors 110 and 112 have their gates connected to the output and inverted output of dual output storage element 104, respectively. The first source/drains of transistors 110 and 112 are connected to one another. The second source/drains of transistors 110 and 112 provide output signals at terminals P2 and $\overline{P2}$, respectively. These signals provide a second port of access to the state of dual output storage element 104. Memory cell 102 further includes a single control transistor 114 having its first source/drain connected to the first source/drains of transistors 110 and 112. The gate of transistor 114 is connected to receive a control signal, $C_S$, while the second source/drain of transistor 114 is connected to ground. Control transistor 114 is an n channel transistor, but may alternatively be a p channel transistor tied high and receiving an active low control signal.

The operation of memory cell 102 is as follows. In order to write information to memory cell 102, the read/write signal is enabled, thereby causing transistors 106 and 108 to conduct. Thereafter differential signals are applied to terminals P1 and $\overline{P1}$ in order to write information to dual output storage element 104. In order to read the state of dual output storage element 104, the combinations of P1 and $\overline{P1}$, and P2 and $\overline{P2}$, provide two different ports from which the state of dual output storage element 104 may be determined. In order to read the first port, the R/W signal is enabled, thereby causing transistors 106 and 108 to conduct. Thereafter, the differential potential between P1 and $\overline{P1}$ may be sensed to determine the state of dual output storage element 104.

In order to read the second port of memory cell 102, contact may be made to terminals P2 and $\overline{P2}$. In particular, it should be noted that the conductivity of transistors 110 and 112 is directly controlled by outputs Q and $\overline{Q}$ of dual output storage element 104. Thus, as dual output storage element 104 changes states, the conductivity of transistors 110 and 112 will likewise change state. In order to read the state of dual output storage element 104 through the second port, a control signal, $C_S$, is applied to the gate of transistor 114 and the differential potential between terminals P2 and $\overline{P2}$ is sensed. For example, in the instance when output Q is high and output $\overline{Q}$ is low, transistor 110 will conduct while transistor 112 will not. After control signal, $C_S$, is applied to transistor 114, terminal P2 will be connected through transistors 110 and 114 to ground while terminal $\overline{P2}$ will float. Thus, the differential voltage between outputs P2 and $\overline{P2}$ may be sensed in order to determine that P2 is of a lesser potential than $\overline{P2}$. Consequently, this differential voltage will signify one state of dual output storage element 104. In the opposite instance, when output Q is low and inverted output $\overline{Q}$ is high, the opposite situation will occur. More particularly, in this instance transistor 112 will conduct while transistor 110 will not. Following the application of a control signal to transistor 114 $\overline{P2}$ will be connected to ground through transistors 112 and 114 while P2 will float. Again, the differential voltage between P2 and $\overline{P2}$ may be sensed which, in this example, would indicate that $\overline{P2}$ is of the lesser potential, thereby indicating that dual output storage element 104 is in its second state. From the above, it may therefore be appreciated that the second port operates as a function of the electrical level at outports Q and $\overline{Q}$ of storage element 104.

Figure 9:
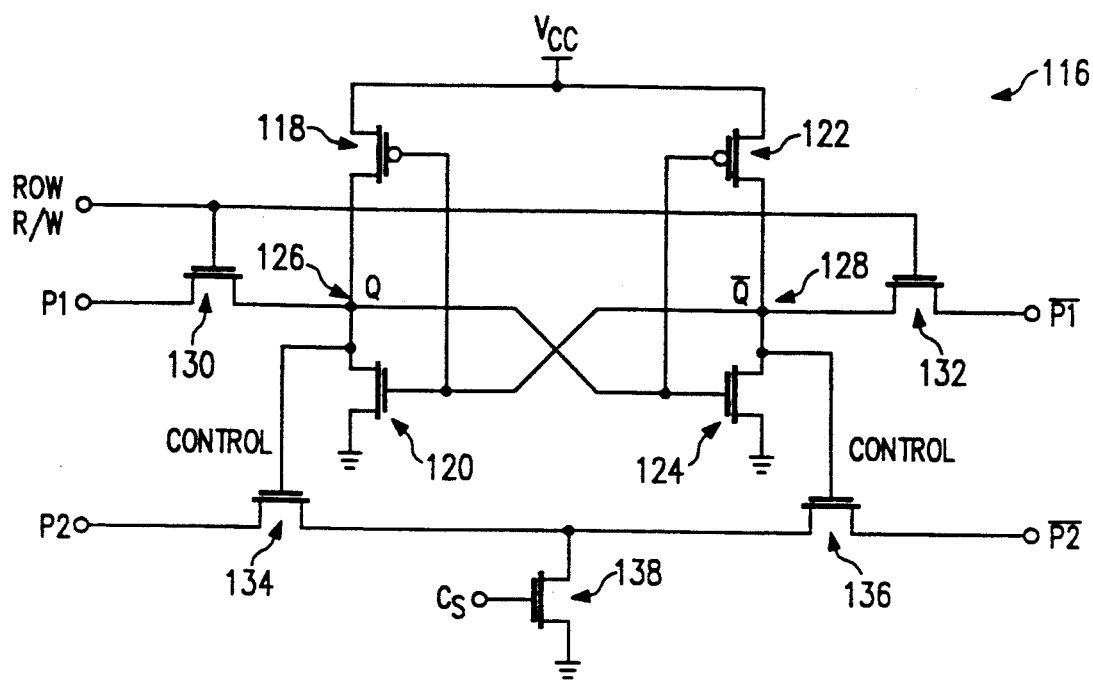
FIG. 9 illustrates a schematic embodiment of an exemplary circuit for the block diagram of FIG. 7.

FIG. 9 illustrates an alternative memory cell 116 constructed in accordance with the principles of memory cell 90 shown in FIG. 7. The storage element of memory cell 116 includes four transistors 118, 120, 122 and 124. Transistors 118 and 122 are p channel transistors while transistors 120 and 124 are n channel transistors. The drains of transistors 118 and 122 are connected to the power supply voltage, $V_{cc}$. The sources of transistors 118 and 122 are connected to the sources of transistors 120 and 124, respectively. The gates of transistors 118 and 122 are connected to the gates of transistors 120 and 124, respectively. The drains of transistors 120 and 124 are connected to ground.

The connection of the sources of transistors 118 and 120 define an output node 126. Similarly, the connection of the sources of transistors 122 and 124 define an inverted output node 128. Nodes 126 and 128 store electrical levels represented by Q and $\overline{Q}$. The gates of transistors 118 and 120 are connected to inverted output node 128. Similarly, the gates of transistors 122 and 124 are connected to output node 126. The interrelationship and interconnection of transistors 118, 120, 122 and 124 create a dual output storage element which is capable of switching between a first state and second state. The particular state of this dual output storage element may be determined by the relative potentials at output node 126 and inverted output node 128.

The read/write circuit of memory cell 116 of FIG. 9 includes transistors 130 and 132. Transistors 130 and 132 are n channel transistors, but alternatively may be p channel transistors receiving an active low signal. The gates of transistors 130 and 132 are connected to one another and are operable to receive the R/W enabling signal. The first source/drain of transistor 130 is connected to output node 126 and, similarly, the first source/drain of transistor 132 is connected to inverted output node 128. The second source/drain of transistor 130 provides a first port terminal, P1, while the second source/drain of transistor 132 provides an inverted first port terminal, $\overline{P1}$. Thus, in order to read from, or write to, the storage element comprising transistors 118 through 124, an R/W signal is provided thereby causing transistors 130 and 132 to conduct. As a result, access may be made to nodes 126 and 128 by the conductive path provided by transistors 130 and 132 to terminals P1 and $\overline{P1}$, respectively.

The second port circuit of memory cell 116 includes transistors 134 and 136 and a control transistor 138. In the illustrated embodiment, transistors 134, 136 and 138 are n channel transistors. The gates of transistors 134 and 136 are connected to output node 126 and inverted output node 128, respectively. The first source/drains of transistors 134 and 136 are connected to one another and further connected to the source of control transistor 138. The second source/drains of transistors 134 and 136 provide the second port terminals P2 and $\overline{P2}$, respectively. The gate of control transistor 138 is connected to receive a control signal, $C_S$, while the drain of transistor 138 is connected to ground. The configuration of transistors 134, 136 and 138 operate in accordance with the same principles discussed above in connection with both FIGS. 7 and 8. Thus the state of the storage element as reflected at nodes 126 and 128 operates to switch transistors 134 and 136. Further, the control transistor 138 operates to receive a control signal such that after the control signal, the state at nodes 126 and 128 may be determined through the second port terminals P2 and $\overline{P2}$.

Figure 10:
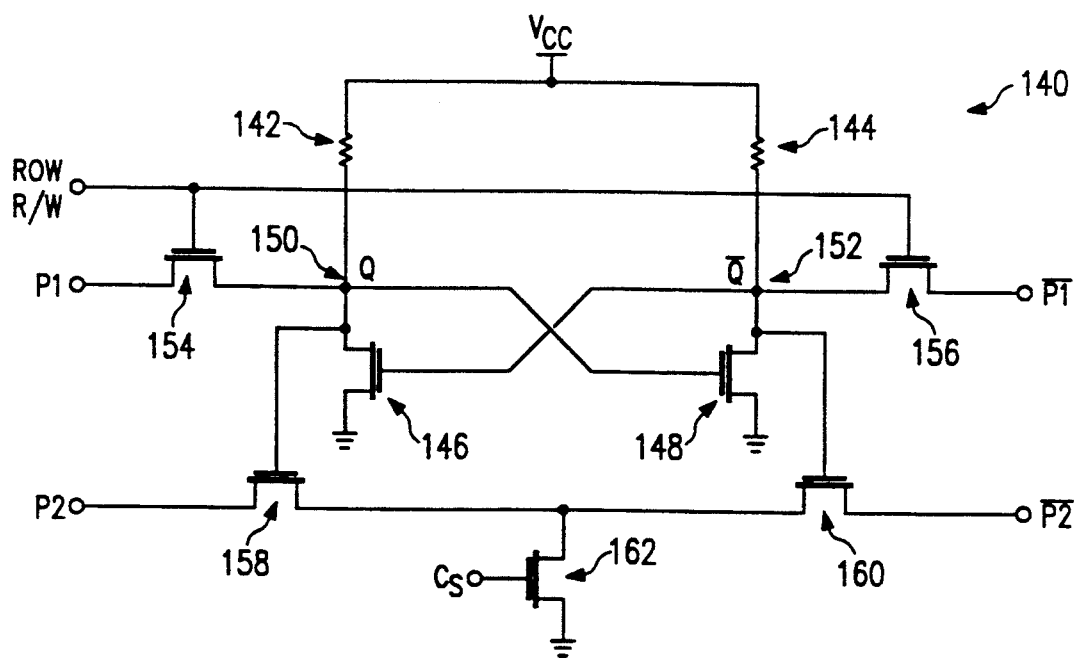
FIG. 10 illustrates a schematic embodiment of an exemplary circuit for the block diagram of FIG. 7.

FIG. 10 illustrates another embodiment of a memory cell 140 constructed in accordance with the principles taught by the block diagram of FIG. 7. The storage circuit of memory cell 140 includes a pair of resistors 142 and 144 as well as a pair of transistors 146 and 148. Transistors 146 and 148 are n channel transistors. Resistors 142 and 144 are connected between a power supply voltage, $V_{cc}$, and output node 150 and inverted output node 152, respectively. Accordingly, it may be appreciated that memory cell 140 utilizes a storage element having resistive devices in lieu of certain transistors. The source of transistor 146 is connected to output node 150 while its drain is connected to ground. Similarly, the source of transistor 148 is connected to inverted output node 152 and its drain is connected to ground. The gates of transistors 146 and 148 are cross-coupled such that the gate of transistor 146 is connected to inverted output node 152 while the gate of transistor 148 is connected to output node 150. Accordingly, the configuration including resistors 142 and 144 and transistors 146 and 148 operates according to known principles such that an SRAM storage element is created. As a result, the state of this cell may be determined by accessing the respective electrical levels stored at nodes 150 and 152.

The read/write circuit of memory cell 140 includes two transistors 154 and 156. Transistors 154 and 156 are n channel transistors. The gates of transistors 154 and 156 are connected to receive the R/W signal in order to enable those transistors. The first source/drains of transistors 154 and 156 are connected to output node 150 and inverted output node 152, respectively. The second source/drains of transistor 154 and 156 provide the output terminals for the first port of memory cell 140, P1 and $\overline{P1}$. The reading and writing of information through output terminals P1 and $\overline{P1}$ is accomplished in the same manner as discussed above in connection with FIG. 9. Thus, a high R/W signal causes transistors 154 and 156 to conduct, thereby permitting either writing to output nodes 150 and 152 or reading the differential voltage from those nodes.

The second port circuit of memory cell 140 comprises transistors 158 and 160 and a control transistor 162. These transistors operate in the same fashion as transistors 134, 136 and 138 discussed above in connection with FIG. 9. Thus, these transistors are controlled and switched by the potential at output nodes 150 and 152. Further, the specific state of the memory cell made up by resistors 142 and 144 as well as transistors 146 and 148 may be determined through the second port output terminals P2 and $\overline{P2}$. This determination is made by providing a control signal, $C_S$, to the gate of transistor 162 and sensing the differential voltage between second port output terminals P2 and $\overline{P2}$.

Figure 11:
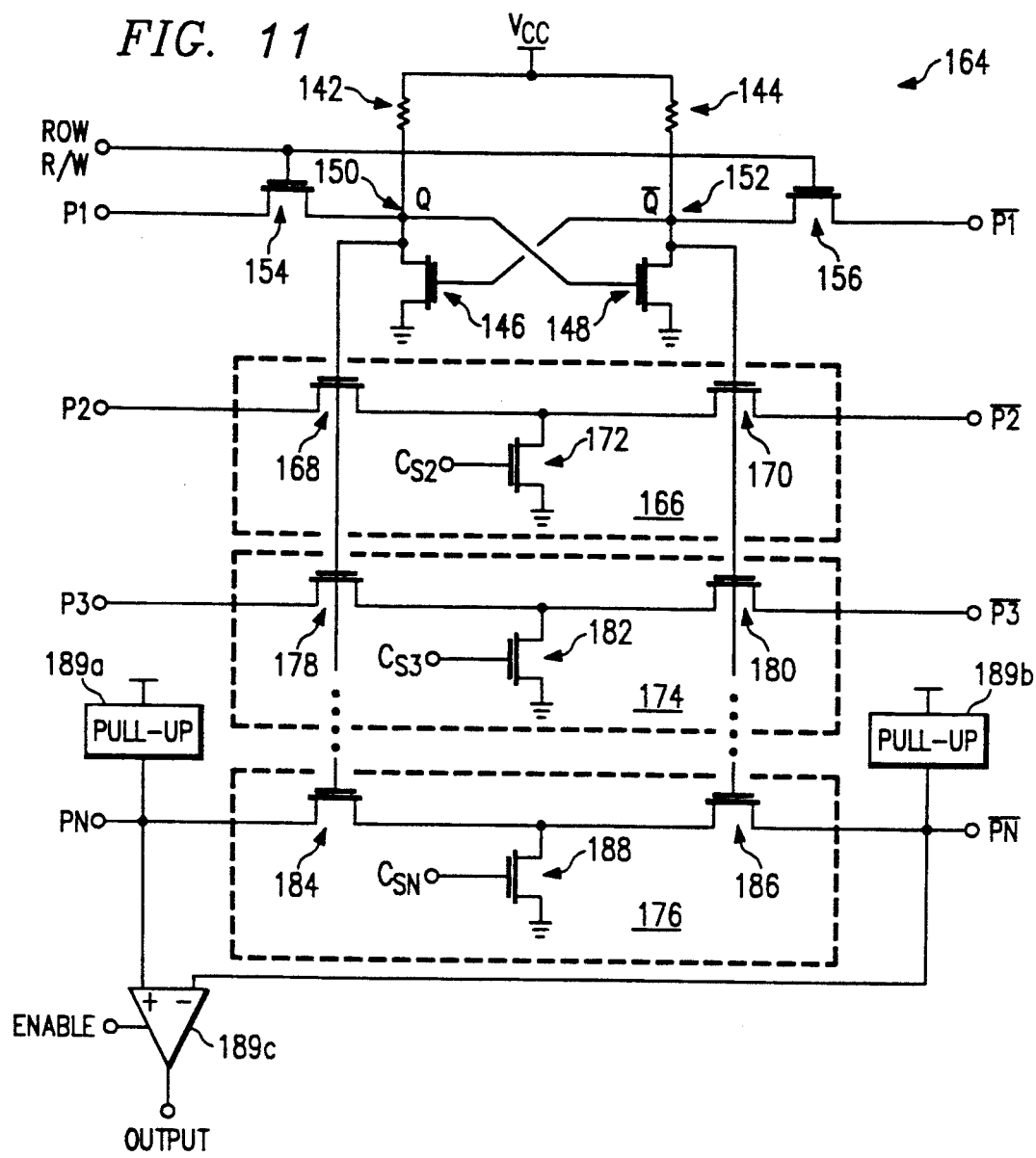
FIG. 11 illustrates a multi-port memory circuit having a plurality of additional ports providing access to the state at nodes Q and Q of an SRAM cell.

FIG. 11 illustrates a memory cell 164 having multiple output ports denoted P1/$\overline{P1}$, P2/$\overline{P2}$, P3/$\overline{P3}$ through PN/$\overline{PN}$. The storage element of memory cell 164 of FIG. 11 is constructed in the same manner as that of memory cell 140 shown in FIG. 10; thus, the same reference numerals for like components are carried forth in FIG. 11. The read/write circuit for the first port is also composed of the same components as those shown in FIG. 10 and, similarly, includes like reference numerals.

Memory cell 164 includes a plurality of additional port circuits, wherein each port circuit includes three transistors. For example, the second port circuit 166 includes three transistors 168, 170 and 172. These transistors are connected and operate in the same fashion as transistors 158, 160 and 162 illustrated and discussed above in connection with FIG. 10. Thus, again transistors 168 and 170 switch as a function of the state of the storage device as reflected at output nodes 150 and 152.

Further, the second port may be read by applying a control signal, $C_{S2}$, to the gate of transistor 172 and sensing the voltage difference between output terminals P2 and $\overline{P2}$.

In a similar manner, memory cell 164 includes additional memory ports 174 and 176. Each additional memory port includes the same transistor configuration as that of second port circuit 166. Thus, port circuit 174 includes transistors 178, 180 and 182 and port circuit 176 includes transistors 184, 186 and 188. From the illustration of FIG. 11, it may be appreciated that a substantial number of desired ports may be parallel in the manner as shown by the cascading of the second, third and Nth port of memory cell 164. The overall loading effect of each of these additional ports is substantially insignificant because each of the ports are connected to output nodes 150 and 152 via the gates of field effect transistors. This connection imposes a relatively high impedance and, therefore, creates only a minimal load on the overall circuit. Further, the cascading provides any number of desired ports in order to permit simultaneous or near simultaneous access to the state of a single memory cell. For illustrative purposes, memory cell 164 is illustrated as including pull-up circuits 189a and 189b connected to port terminals PN and $\overline{PN}$, respectively. Also illustrated is a sense amplifier 189c connected between port terminals PN and $\overline{PN}$ for determining the relativity of the voltage signals at those terminals. Again, these pull-up circuits and the sense amplifier may be included with each of the embodiments discussed herein to facilitate reading of the state of each memory cell.

Figure 12:
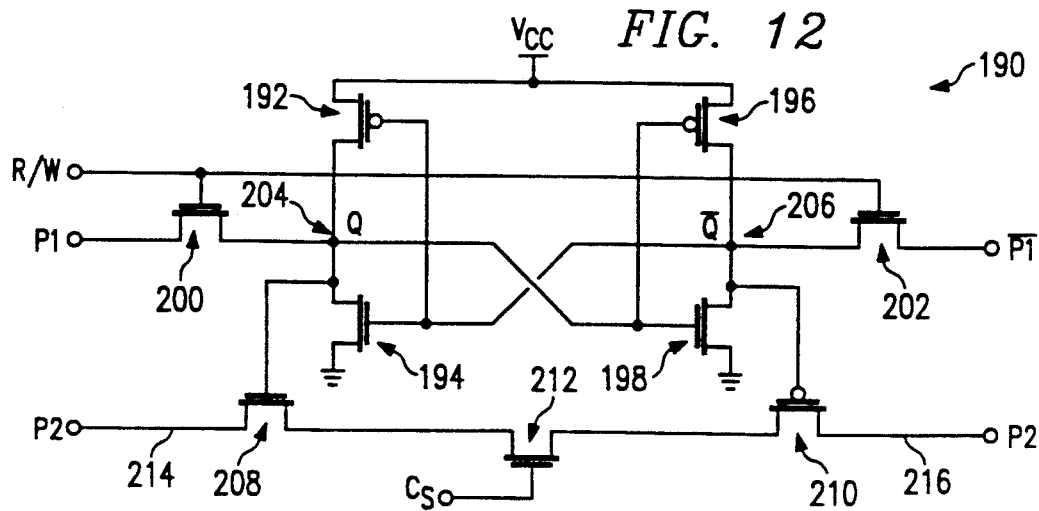
FIG. 12 illustrates a dual port memory cell wherein the control switching device of the second port is connected in series with the switching transistors of that port.

FIG. 12 illustrates an additional embodiment of a memory cell 190. Memory cell 190 includes a storage element having four transistors 192, 194, 196 and 198. Transistors 192 through 198 are the same type of transistors and are configured in the same manner as transistors 118, 120, 122 and 124, respectively, discussed as a storage element in connection with FIG. 9, above. Additionally, the read/write circuit of memory cell 190 includes transistors 200 and 202 connected in the same manner as transistors 130 and 132, respectively, of the read/write circuit of FIG. 9. These transistors also operate in the same manner as discussed above in connection with FIG. 9. Thus, transistors 200 and 202 are capable of transmitting the electrical level at output node 204 and inverted output node 206 to output terminals P1 and $\overline{P1}$, respectively.

The second port circuit for FIG. 12 is illustrated as comprising three transistors 208, 210 and 212. Unlike the previous second port circuits, however, transistors 208 and 210 are of the opposite conductivity type. Thus, in the illustrated example, transistor 208 is an n channel transistor while transistor 210 is a p channel transistor. As a result, the output potential at output nodes 204 and inverted output node 206 will cause transistors 208 and 210 to operate in the same conductive state rather than reciprocal conductive states (i.e., one transistor conducting, one not) as discussed above. For example, in the instance when output node 204 is high, transistor 208 will conduct. At the same time, inverted output node 206 will be low and, as a result, transistor 210 will conduct. Alternatively, when output node 204 is low, transistor 208 will be off and similarly, inverted output node 206 will cause transistor 210 also to be off. As a result, the outputs 214 and 216 of the second port will not be complementary signals as previously illustrated, but instead, will define either an open or closed conductive path between terminals P2 and P2. The conductivity of the path is controlled by, and therefore is a function of, the state at nodes 204 and 206. Thus, the conductivity between terminals P2 and P2 is sensed as described below to determine the state of memory cell 110.

In order to determine the state of the memory cell through the second port, a control signal is applied to the gate of transistor 212 causing it to conduct. Thereafter, the conductivity or impedance between output 214 and output 216 is detected. If a low impedance condition is detected (i.e., transistors 208 and 210 both on), the memory cell 190 is determined to be in one state. Conversely, if a very large impedance is detected (i.e., transistors 208 and 210 both off), the second state of storage is determined. The port circuit 172 of FIG. 11 has the bilateral symmetry of a "T" or a "Y". The port circuit 208, 212, 210 has a bilateral symmetry of a series of elements.

It should also be appreciated from reviewing the second port circuit of FIG. 12 that transistor 212 may be eliminated and substituted by a direct connection between transistors 208 and 210. In this embodiment, the determination of the either high impedance or low impedance between outports 214 and 216 may be performed without the need for transistor 212 and the control signal, $C_S$.

Figure 13:
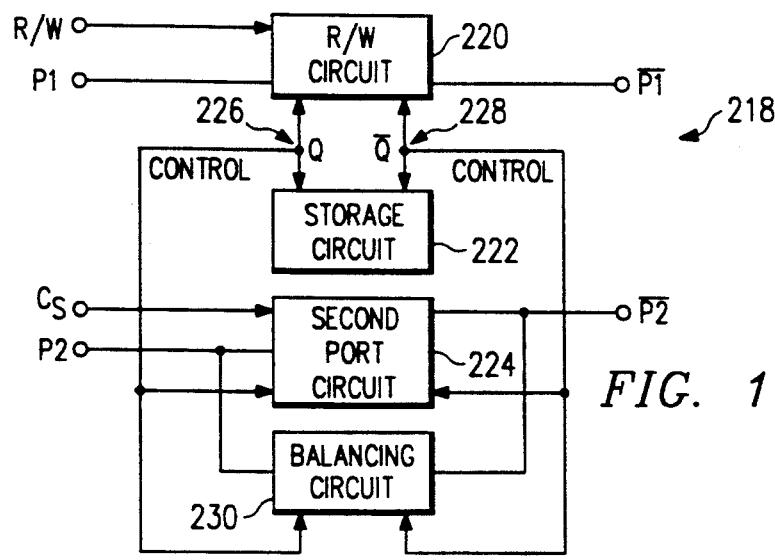
FIG. 13 illustrates a block diagram of a dual port memory cell having a storage circuit with complementary outputs and further including a balancing circuit.

FIG. 13 illustrates a block diagram of a memory cell 218. Memory cell 218 includes three of the same blocks as memory cell 90 illustrated in FIG. 7. Thus, memory cell 218 includes a read/write circuit 220, a storage circuit 222 and a second port circuit 224. Read/write circuit 220, storage circuit 222 and second port circuit 224 operate in the same fashion as the analogous components discussed in connection with FIG. 7. Accordingly, storage circuit 222 may be written to, or read from, through read/write circuit 220 while the data is reflected at output node 226 and inverted output node 228. Similarly, output node 226 and inverted output node 228 provide control signals to second port circuit 224 which operates as a function of, and may also be read in order to determine the state of, storage circuit 222.

An additional balancing circuit 230 is provided with memory cell 218. Balancing circuit 230 is also controlled by the electrical level stored at output nodes 226 and 228. Balancing circuit 230 balances the output signals generated by second port circuit 224 so that these signals have substantially the same rise and delay times irrespective of the state of storage circuit 222. The particular componentry of balancing circuit 230 is chosen in a manner to offset any impedance and parasitic capacitance effects created by second port circuit 224. As a result, the timing of the output signals at terminals P2 and $\overline{P2}$ is substantially equivalent. Thus, even during high speed applications the outputs of second port circuit 224 are substantially balanced and, therefore, remain consistent irrespective of the state of storage circuit 222.

Figure 14:
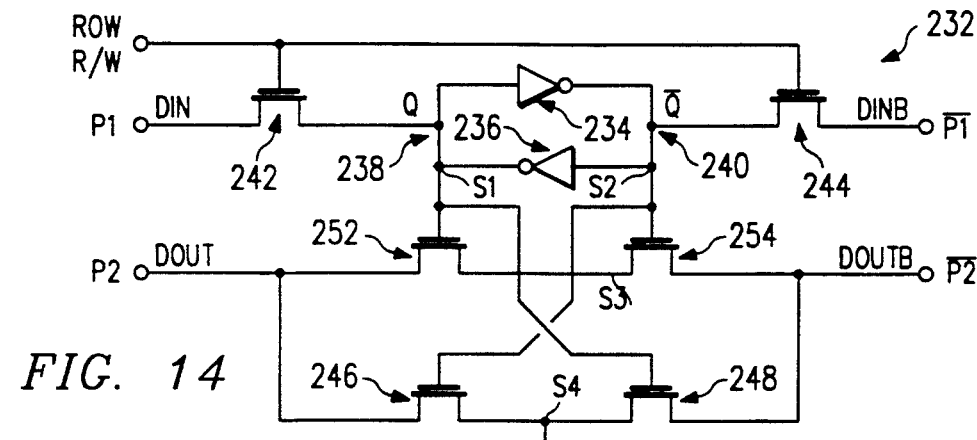
FIG. 14 illustrates a schematic of one embodiment of the block diagram of FIG. 13.

FIG. 14 illustrates a schematic embodiment of a memory cell 232 having various components in accordance with the blocks set forth in memory cell 218 of FIG. 13. The storage circuit of memory cell 232 includes a first and second inverter 234 and 236. The input of inverter 234 is connected to the output of inverter 236, and both connections are further connected to output node 238. Similarly, the input of inverter 236 is connected to the output of inverter 234, and both connections are connected to inverted output node 240.

The read/write circuit of memory cell 232 includes two transistors 242 and 244. Transistors 242 and 244 are n channel transistors. The gates of transistors 242 and 244 are connected to one another and are operable to receive a R/W signal. Transistor 242 and 244 may alternatively be p channel transistors if the R/W signal were an active low signal. The first source/drains of transistors 242 and 244 are connected to output node 238 and inverted output node 240, respectively. The second source/drains of transistors 242 and 244 provide the first port output terminals P1 and $\overline{P1}$. The specific operation of transistors 242 and 244 occurs in the same manner as transistors 200 and 202 discussed above in connection with FIG. 12.

The second port circuit of memory cell 232 includes transistors 246 and 248 as well as a control transistor 250. Each of transistors 246, 248 and 250 are n channel transistors and are connected and operate in the same manner as discussed above in connection with each of FIGS. 9-11. Accordingly, the electrical level at output nodes 238 and 240 control the conductive states of transistors 246 and 248. Additionally, following the imposition of a control signal, $C_S$, to transistor 250, the state of memory cell 232 may be ascertained by sensing the differential voltage at output terminals P2 and $\overline{P2}$.

Memory cell 232 further includes a balancing circuit which comprises transistors 252 and 254. Transistors 252 and 254 are selected to provide symmetric function, capacitance and interconnection of transistors 246 and 248. As a result, transistors 252 and 254 are both n channel transistors and have their gates cross-coupled to transistors 246 and 248. The balancing effect of transistors 252 and 254 causes the output signals at terminals P2 and $\overline{P2}$ to be balanced. Accordingly, the rise and fall times, and the amplitudes of these signals at terminals P2 and $\overline{P2}$ are balanced such that those parameters are substantially the same irrespective of whether the state of memory cell 232 is either high or low.

Figure 15:
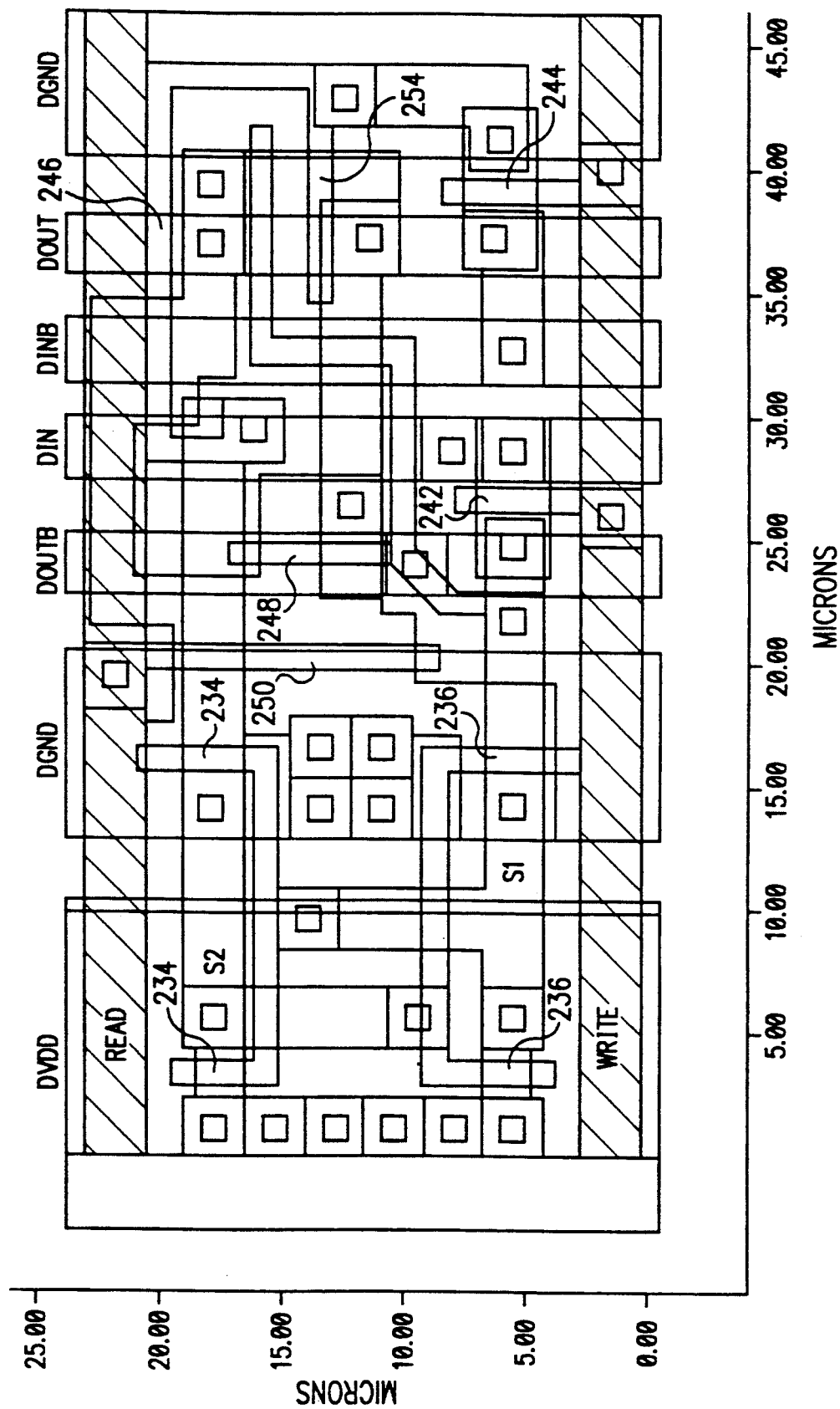
FIG. 15 illustrates a semiconductor layout of the schematic shown in FIG. 14.

FIG. 15 illustrates a layout of the circuit configuration shown in FIG. 14. FIG. 15 demonstrates that memory cell 232 efficiently packs an area of about 24×50 microns for a use as a dual port SRAM. The reference numerals and designations of FIG. 14 are carried forward in FIG. 15 and, therefore, indicate the position of each component device.

Figure 16:
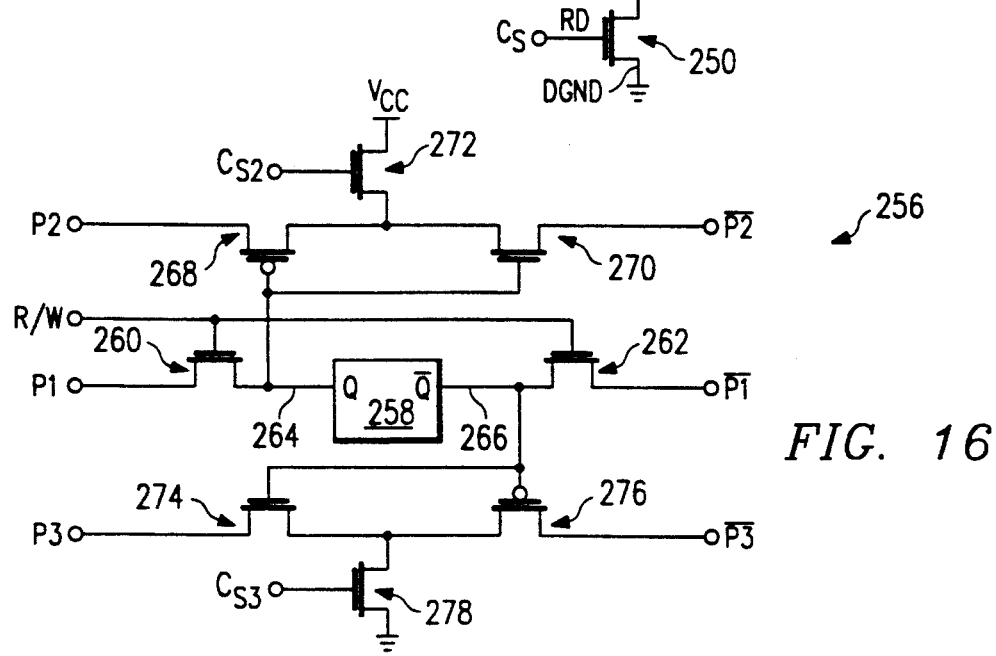
FIG. 16 illustrates a three port memory cell wherein the second and third ports are controlled by the output and inverted output of the storage element, respectively.

FIG. 16 illustrates another embodiment of a memory cell 256. Memory cell 256 is a three port memory cell by which the state of a storage element 258 may be determined through sensing the differential voltages at any one of three ports denoted P1/$\overline{P1}$ through P3/$\overline{P3}$. The first port includes transistors 260 and 262. The gates of transistors 260 and 262 are connected to one another and receive the R/W signal. The first source/drains of transistors 260 and 262 are connected to output node 264 and inverted output node 266, respectively. The second source/drains of transistors 260 and 262 provide output signals for the first port terminals P1 and $\overline{P1}$. As a result, it may be appreciated from FIG. 16 that memory cell 256 may be written to or read from via terminals P1 and $\overline{P1}$ through transistors 260 and 262 after enabling the R/W signal.

Two additional ports are provided with memory cell 256 in order to read the state of storage element 258. In particular, a second port comprises two transistors 268 and 270 as well as a control transistor 272. Transistor 268 is a p channel transistor while transistor 270 is an n channel transistor. The gates of transistors 268 and 270 are connected to output node 264 and, therefore, are controlled by the state of storage element 258. The first source/drains of transistors 268 and 270 are connected to the drain of control transistor 272. The second source/drains of transistors 268 and 270 are connected to second port terminals P2 and $\overline{P2}$, respectively. The gate of control transistor 272 is connected to receive a control signal, $C_{S2}$, and the source of control transistor 272 is connected to the power supply voltage, $V_{cc}$.

The reading of the state of storage element 258 through the second port is similar to that discussed above in connection with the various other embodiments. Two significant differences, however, exist in that first, both transistors 268 and 270 are controlled by a single output of the two output storage element 258. Second, control transistor 272 is connected to the power supply voltage rather than ground as was the case in many of the previous embodiments. Thus, in operation, storage element 258 provides either a high or low electrical level at output node 264. This electrical level causes either transistor 268 or 270 to conduct. For example, when output node 264 is high, transistor 270 will conduct while transistor 268 will not. Thereafter, a control signal, $C_{S2}$, is applied to the gate of control transistor 272 causing it to conduct. This conductive path allows the power supply voltage to conduct through transistors 272 and 270 to the second port terminal $\overline{P2}$. As a result, the differential voltage may be sensed between P2 and $\overline{P2}$, thereby determining the state of storage element 258. In the opposite instance when storage element 258 provides a low signal at output node 264, transistor 268 will conduct while transistor 270 will not and, as a result, the potential at terminal P2 will be relatively higher than the potential at $\overline{P2}$.

The third port of memory cell 256 includes transistors 274 and 276 as well as a control transistor 278. Transistor 274 is an n channel transistor and transistor 276 is a p channel transistor. These transistors are configured in a similar manner as transistors 268 and 270 of the second port, but have their gates both connected to inverted output node 266. Therefore, transistors 274 and 276 are controlled by the electrical level at node 266. Control transistor 278 is illustrated as an n channel transistor, but could be a p channel transistor controlled by an active low signal. The state of storage element 258 may be ascertained at the third port by sensing the differential voltage between terminals P3 and $\overline{P3}$ following the imposition of a control signal, $C_{S3}$, to the gate of transistor 278. For illustrative purposes, it should be noted that the drain of control transistor 278 is connected to ground and as a result, a conductive path to ground will be formed through transistor 278 and either transistor 274 or 276 depending on which is caused to conduct by the electrical level at inverted output node 266.

Figure 17A:
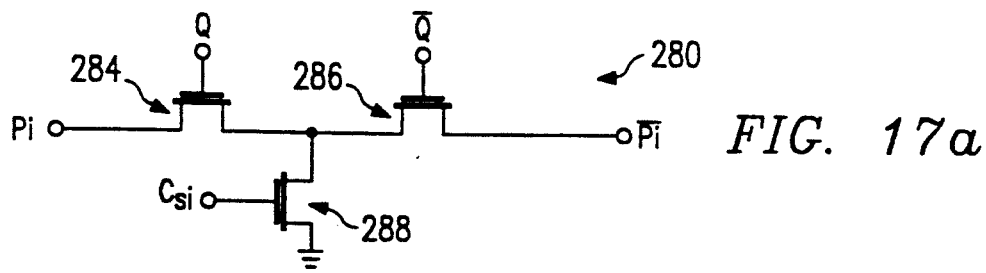
FIG. 17a illustrates a port circuit to be controlled by complementary output signals from a storage element.
Figure 17B:
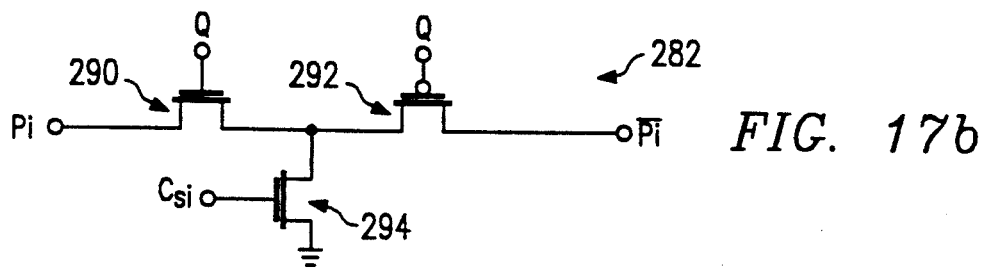
FIG. 17b illustrates a port circuit to be controlled by like output signals from a storage element.

FIGS. 17a and 17b illustrate additional embodiments 280 and 282, respectively. Embodiments 280 and 282 illustrate that various configurations may be established such that for one control transistor configuration, like conductivity-type transistors should be used for complementary output control signals and opposite conductivity-type transistors should be used for the same output control signal. In particular, embodiment 280 includes transistors 284 and 286 as well as a control transistor 288. Transistors 284 and 286 are n channel transistors. Thus, it may be appreciated that transistors 284 and 286 are of the same conductivity-type. It should be further noted that the gates of transistors 284 and 286 are connected to complementary control signals Q and $\overline{Q}$. As a result, the conductive state of both transistors 284 and 286 are ensured to be the opposite of one another. For example, where signal Q is high, signal $\overline{Q}$ will be low. The high signal Q will cause transistor 284 to conduct while the low signal $\overline{Q}$ will cause transistor 286 not to conduct. In the opposite instance when signal Q is low, signal $\overline{Q}$ will be high. Consequently, transistor 284 will be off and transistor 286 will be on. Control transistor 288, being configured between transistors 284, 286 and ground will, therefore, only connect one terminal Pi or $\overline{\text{Pi}}$ to ground at a time.

Embodiment 282 of FIG. 17b illustrates the opposite concept of FIG. 17a. In particular, when like control signals are used, opposite conductivity-type transistors should also be used. Thus, embodiment 282 includes two transistors 290 and 292 as well as a control transistor 294. In embodiment 282, transistors 290 and 292 are opposite conductivity-type because their gates are controlled by the same control signal, Q. As a result, only one of the two transistors will be on at a time depending on the state of signal Q. Thus, from FIGS. 17a and 17b it may be appreciated that the configuration of the control transistor as well as the relativity of the output control signals affects the selection of the conductivity-types of the transistors between terminals Pi and $\overline{\text{Pi}}$.

Figure 17C:
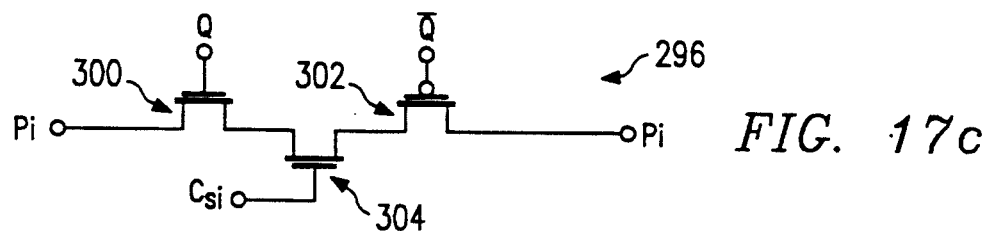
FIG. 17c illustrates a port circuit to be controlled by complementary output signals from a storage element wherein the control switching device is connected in series with the first and second switching devices.
Figure 17D:
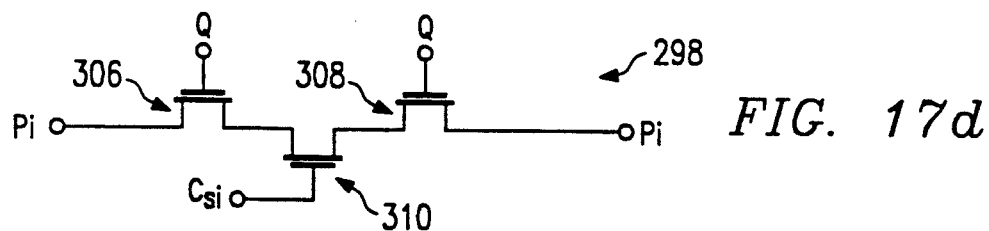
FIG. 17d illustrates a port circuit to be controlled by like output signals from a storage element wherein the control switching device is connected in series with the first and second switching devices.

FIGS. 17c and 17d illustrate an analogous concept to that shown in FIGS. 17a and 17b, that is, both the control transistor configuration and the relativity of the output control signals determine the conductivity-type of the transistors which should be used. In particular, FIG. 17c and 17d illustrate embodiments 296 and 298, respectively, wherein each embodiment includes a control transistor connected in series between the transistors connected to the port output terminals. Embodiment 296 includes two transistors 300 and 302 as well as a control transistor 304. Unlike embodiment 280 of FIG. 17a, transistors 300 and 302 of embodiment 296 are opposite, rather than the same, conductivity-types. This selection of type arises because control transistor 304 has its respective source/drain connected in series with transistors 300 and 302 in the same manner as transistor 212 discussed above in connection with FIG. 12. This control transistor configuration has both transistors 300 and 302 operate in the same conductive state at the same time. Accordingly, because complementary control signals are input, complementary transistor types must also be used. Thus, the output terminals, both denoted Pi, may be sensed in order to determine whether there is a high impedance (no conduction) or a low impedance (conduction) between the two terminals denoted Pi.

Embodiment 298 of FIG. 17d includes two transistors 306 and 308 as well as a control transistor 310 connected in series between transistors 306 and 308. Embodiment 298 of FIG. 17d is similar to embodiment 282 in that transistors 306 and 308 are controlled by the same output signal, Q. However, control transistor 310 is connected in series with transistors 306 and 308 and, therefore, transistors 306 and 308 must be selected to operate in the same conductive state at the same time. Accordingly, because like control signals are input to transistors 306 and 308, those transistors should be chosen as having like conductivity-types. As a result, both transistors 306 and 308 will either conduct or not conduct in accordance with the signal, Q. Again, the two terminals denoted Pi may be sensed in order to determine whether there is a low or high impedance between the two.

Figure 18:
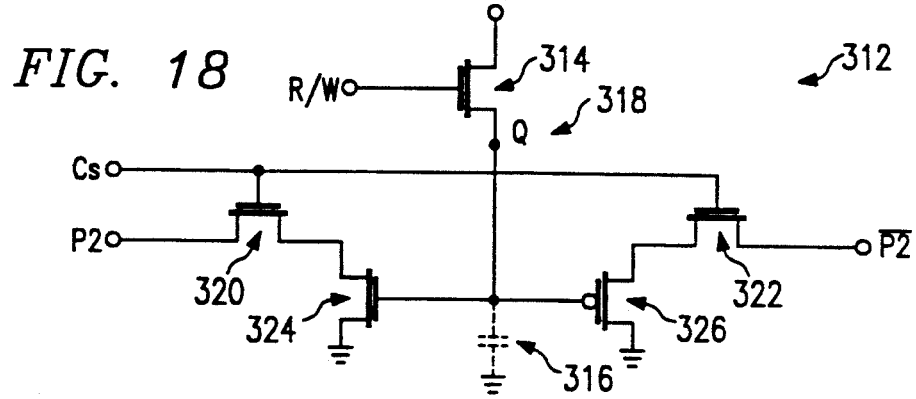
FIG. 18 illustrates an alternative embodiment memory cell wherein each port terminal of the second port includes respective control and switching transistors.

FIG. 18 illustrates an embodiment of a two port memory cell 312. Memory cell 312 includes a DRAM portion including a transistor 314 and a capacitor 316. Transistor 314 has its gate connected to receive the R/W signal, its drain connected to an output node 318 and its source connected to the first port output terminal, P1. Output node 318 is further connected to capacitor 316 which is also connected to ground. Capacitor 316 is illustrated in phantom to show that an actual capacitor element may be formed or alternatively, the parasitic capacitance of the remaining components of memory cell 312 may be used in order to store the electrical level at output node 318. Transistor 314 is illustrated as an n channel transistor but may alternatively be a p channel transistor receiving an active low R/W signal.

Memory cell 312 further includes a second port circuit having control transistors 320 and 322, and transistors 324 and 326 therein. Control transistors 320 and 322 have their first source/drains connected to respective output port terminals P2 and $\overline{\text{P2}}$. Control transistors 320 and 322 have their second source/drains connected to respective first source/drains of transistors 324 and 326. Transistors 324 and 326 connect control transistors 320 and 322, respectively, to ground. Additionally, the electrical level at output node 318 is connected to the gates of transistors 324 and 326. Transistor 324 is an n channel transistor while transistor 326 is a p channel transistor. Accordingly, the electrical level stored at output node 318 will cause one or the other of transistors 324 or 326 to conduct at a time. As a result, depending upon the electrical level at output node 318 following the imposition of a control signal, $C_S$, either terminal P2 or terminal $\overline{\text{P2}}$ will be connected to ground. As a result, again the differential voltage between P2 and $\overline{\text{P2}}$ may be sensed in order to determine the state at output node 318.

Figure 19:
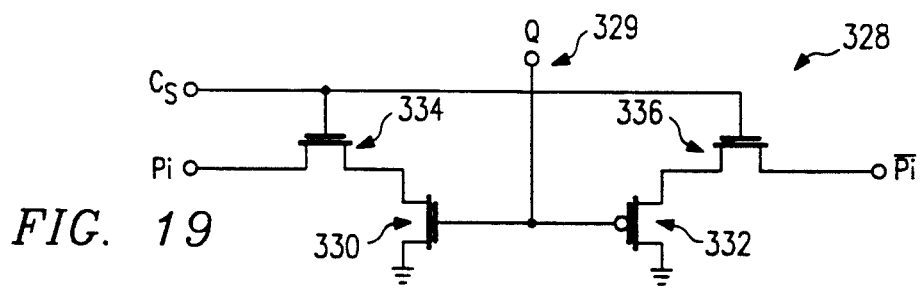
FIG. 19 illustrates an alternative embodiment memory cell wherein each port terminal of the second port includes respective control and switching transistors.

FIG. 19 illustrates a memory cell port circuit 328. Memory cell port circuit is controllable by the electrical level at a single output node designated 329. Thus, any memory cell capable of providing a single output electrical level, Q, may be combined with memory cell port circuit 328 in order to provide an additional port or ports of access to the state of the memory cell providing electrical level Q. Memory cell port circuit 328 includes two transistors 330 and 332 as well as two control transistors 334 and 336. Transistor 334 has a first source/drain connected to a first source/drain of transistor 330. The second source/drain of transistor 334 is connected to one terminal of the port output denoted Pi. The second source/drain of transistor 330 is connected to ground. However, similar to various other embodiments discussed above, it should be understood that the second source/drain of transistor 330 could be connected to an alternative reference voltage such as a power supply voltage, $V_{cc}$.

Transistors 336 and 332 are connected in a manner similar to that as discussed in connection with transistors 334 and 330, respectively. Thus, transistor 336 is connected in series between the inverted output port $\overline{\text{Pi}}$ and transistor 332. Transistor 332 is connected between transistor 336 and a reference voltage which is illustrated in FIG. 19 as ground. The gates of both transistors 330 and 332 are connected to node 329. Thus, it may be appreciated that the single electrical level Q provided at node 329 affects the conductivity of both transistors 330 and 332. Accordingly, the state at node 329 may be determined by applying a control signal $C_S$ to the gates of control transistors 334 and 336 and sensing the differential voltage between output terminals Pi and $\overline{\text{Pi}}$.

Figure 20:
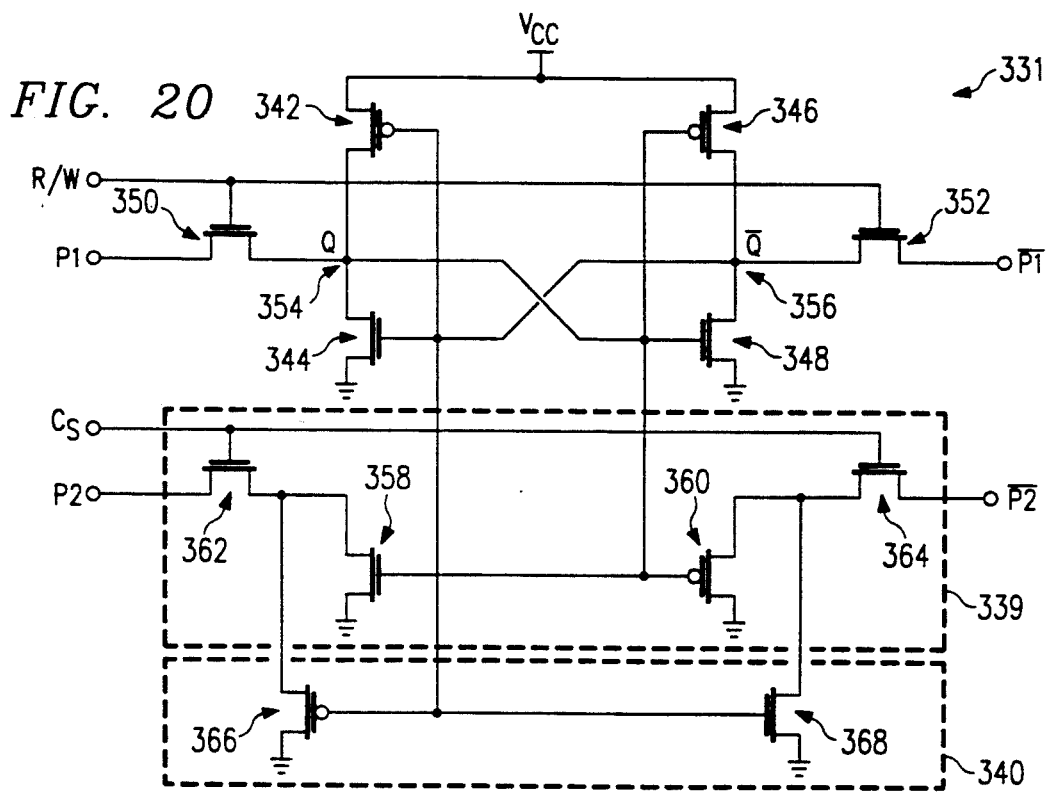
FIG. 20 illustrates an SRAM storage element wherein the electrical level at one node of the SRAM controls the second port circuit and the complementary output node of the SRAM controls a balancing circuit.

FIG. 20 illustrates a balanced memory cell 331 including components making up a storage element, a read/write circuit, a memory cell port circuit (which is the same as circuit 328 in FIG. 19) which creates a second port circuit 339, and a balancing circuit 340. The memory storage element comprises four transistors 342, 344, 346 and 348. These transistors are connected in the same configuration as transistors 118, 120, 122 and 124 discussed above in connection with memory cell 116 of FIG. 9. Additionally, a read/write circuit is created using transistors 350 and 352 in the same manner as discussed in connection with transistors 130 and 132 of FIG. 9. The combination of the read/write and memory storage circuits of memory cell 331 permit information to be stored to, and read from, output node 354 and inverted output node 356.

The electrical level stored at output node 354 provides a control signal to second port circuit 339 in the same manner as discussed in connection with memory cell port circuit 328 of FIG. 19. In particular, output node 354 is connected to the gates of transistors 358 and 360. These transistors permit selective grounding of control transistors 362 and 364 such that the differential voltage may be sensed between output terminals P2 and $\overline{\text{P2}}$. In this manner, the state at output node 354 may be determined by sensing this differential voltage.

Balancing circuit 340 includes two transistors 366 and 368. Transistor 366 is a p channel and transistor 368 is an n channel transistor. The gates of both transistors 366 and 368 are connected to inverted output node 356. The first source/drain of transistor 366 is connected between the first source/drains of transistors 362 and 358. The second source/drain of transistor 366 is connected to ground. Similarly, the first source/drain of transistor 368 is connected between the first source/drains of transistors 364 and 360. Additionally, the second source/drain of transistor of 368 is connected to ground. By reviewing the interconnections of balancing circuit 340 to second port circuit 339 and inverted output node 356, it may be appreciated that balancing circuit 340 completes a symmetric connection of components such that both output node 354 and inverted output node 356 are connected to the gates of symmetrical transistor configurations. This symmetry ensures an equivalent impedance and parasitic capacitance irrespective of the state stored at output nodes 354 and 356. This balancing approach ensures that signal timing is uniform irrespective of the states at output nodes 354 and 356 as discussed in greater detail above in connection with block 230 of FIG. 13.

Figure 21:
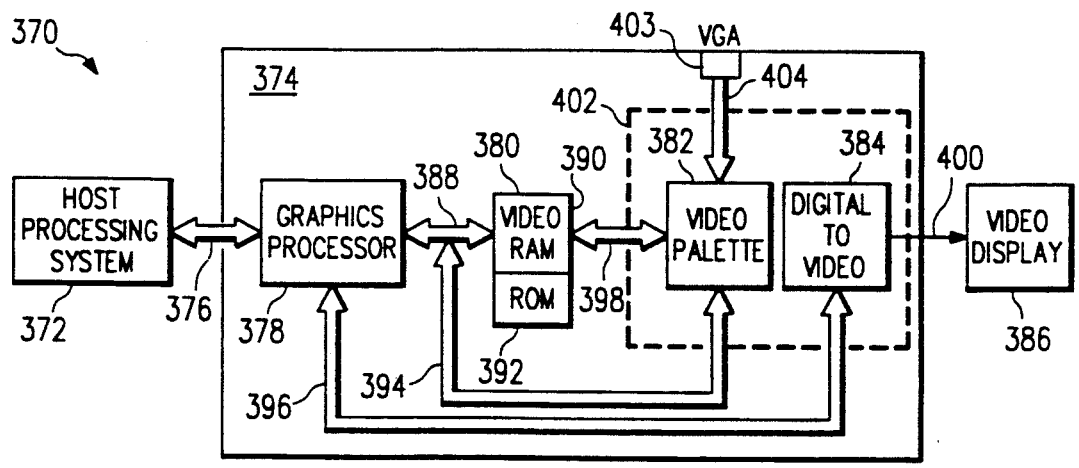
FIG. 21 illustrates a block diagram of a video graphics system in accordance with the present invention.

FIG. 21 illustrates a block diagram of a graphics computer system 370 in which the various embodiments of memory cells described above may be used in order to produce significantly advantageous results. In particular, graphics computer system 370 includes a host processing system 372 coupled to a graphics printed wiring board 374 through a bidirectional bus 376. Printed wiring board 374 includes a graphics processor 378, a memory 380, a video palette 382 and a digital-to-video converter 384. Video palette 382 and digital-to-video converter 384 may be integrated together to form a "programmable palette" 402 or simply a "palette" 402.

The cumulative components of graphics printed wiring board 374 are used to drive a video display 386.

Host processing system 372 provides some computational capacity for graphics computer system 370, and determines the content of the visual display to be presented to a user via video display 386. The details of the construction of host processing system 372 are conventional in nature and known in the art and, therefore, are not discussed in further detail herein.

Graphics processor 378 provides the data manipulation capability required to generate the particular video display presented to the user. While graphics processor 378 operates as a data processor independent of host processing system 372, graphics processor 378 is fully responsive to requests which may be output by host processing system 372. Graphics processor 378 further communicates with memory 380 via a video memory bus 388. Graphics processor 378 controls the data stored within video RAM 390, wherein RAM 390 forms a portion of memory 380. In addition, graphics processor 378 may be controlled by programs stored in either video RAM 390 or in read-only memory 392. Read-only memory 392 may also include various types of graphic image data such as alphanumeric characters in one or more font styles, and frequently used icons. Further, graphics processor 378 controls data stored within video palette 382 via a bidirectional bus 394. Finally, graphics processor 378 controls digital-to-video converter 384 via a video control bus 396.

Video RAM 390 contains bit map graphic data which controls the video image presented to the user as manipulated by graphics processor 378. In addition, video data corresponding to the current display screen is output from video RAM 390 on bus 398 to video palette 382. Video RAM 390 may consist of a bank of several separate random access memory integrated circuits, the output of each circuit typically being one or four bits wide as coupled to bus 398.

Video palette 382 receives high-speed video data from video random access memory 390 via bus 398 and data from graphics processor 378 via bus 394. In turn, palette 402 converts the data received on bus 398 into a video level which is output on bus 400. This conversion permits the amount of memory in video RAM 390 to be reduced while retaining the capability of choosing among a large number of colors. In particular, the data in video RAM 390 provides a color code to video palette 382. Video palette 382 contains various video data words which are then addressed by the color code coming from video RAM 390. The conversion of code to data word is achieved by means of a look-up table which is specified by graphics processor 378 via video memory bus 394. The data word output of video palette 382 may comprise color, hue and saturation signals for each picture element, or may comprise red, green and blue primary color levels for each pixel. For example, these three parallel digital signals can have eight bits each, using twenty-four bit locations in the look-up table. Digital to video converter 384 converts the digital output of video palette 382 into the necessary analog levels for application video display 388 via bus 400.

The memory cells and methods described herein are advantageously applied wherever multiple access memory is implemented in FIG. 21 such as in the host 372, graphics processor 378, video RAM 380, video pallete 382, and video display 386. A preferred embodiment suitably provides look-up table SRAM according to FIGS. 14 and 15 in a 256×24 bit array in video palette 382, for example.

Printed wiring board 374 also includes a VGA pass through port 403 coupled to palette 402 by VGA bus 404. In the VGA pass through mode, data from the VGA connector of most VGA supported personal computers is fed directly into palette 402 without the need for external data multiplexing. This direct connection allows a replacement graphics board to remain "downward compatible" utilizing the existing graphic circuitry often located on the mother board of the associated host processing system 372.

Video display 386 receives the video output from digital-to-video converter 384 and generates the specified video image for viewing by the user of graphics computer system 370. Significantly, video palette 382, digital-to-video converter 384 and video display 386 may operate in accordance with two major techniques. In the first technique, video data is specified in terms of color, hue and saturation for each individual pixel. In the second technique, the individual primary color levels of red, blue and green are specified for each individual pixel. Upon selection of the desired design using either of these two techniques, video palette 382, digital-to-video converter 384 and video display 386 are customized to implement the selected design. However, the principles of system 370 are unchanged regardless of the particular design choice of the video technique. All of the signals that contribute to display color in some way are regarded as color signals even though they may not be of the red, blue, green technique.

For purposes of either video RAM 390 or palette 402, due to the rapid exchange and amount of information, there may be a great need for simultaneously or near simultaneously writing data to, and reading data from, either video RAM 390 or video palette 402. Accordingly, it is desirable for both video RAM 390 and palette 402 to include multiple ports for access to the particular memory locations for each. As a result, it may be appreciated that the many embodiments described hereinabove may be implemented in either video RAM 390 or palette 402 in order to provide either dual port or multiport access to the particular memory cells within either of those random access memories. The particular advantages discussed in connection with the embodiments above would therefore propagate into the overall performance of system 370. As a result, signal integrity is improved as well as system speed and accuracy. Ultimately, these advantages manifest themselves in terms of a more accurate and reliable video output signal along bus 400 to video display 386.

Other systems in which the present embodiments may produce significant advantages are described in the following patents and patent applications, all filed on Jun. 27, 1990, and all assigned to Texas Instruments Incorporated, the assignee of the present application, and are fully incorporated into the present application by reference.

| Serial No. | Docket No. | Title |
| --- | --- | --- |
| 7/545,422 | TI-15022 | Palette Devices, Computer Graphics Systems and Methods With Parallel Lookup and Input Signal Splitting |
| 7/544,774 | TI-15119 | Palette Devices, Systems and Methods For True Color Mode |

-continued

| Serial No. | Docket No. | Title |
| --- | --- | --- |
| 07/545,421 | TI-15120 | Devices, Systems an Methods for Palette Pass Through Mode |
| 07/544,771 | TI-15121 | Integrated Circuit Internal Test Circuits and Methods |
| 07/546,172 | TI-15122 | Controlled Delay Devices, Systems and Methods |
| 07/544,775 | TI-15123 | Packed Bus Selection of Multiple Pixel Depths in Palette Devices, Systems and Methods |
| 07/545,424 | TI-15124 | Graphics Systems, Palettes and Methods with Combined Video and Shift Clock Control |
| 07/544,779 | TI-14523 | Computer Graphics Systems, Palette Devices and Methods for Shift Clock Pulse Insertion During Blanking |
| 07/387,472 | TI-14313 | Graphics Processor Having a Floating Point Co-Processor |

U.S. Pat. No. 4,752,893
U.S. Pat. No. 4,718,024
U.S. Pat. No. 4,933,878
U.S. Pat. No. 5,025,407

Although the present invention has been described in detail, it should be understood that various substitutions, alterations and modifications may be made hereto without departing from the spirit and scope of the invention as defined by the appended claims. For example, the numerous transistors discussed herein could be replaced by alternative switching devices. Another example is that various transistors may be chosen of different conductivity-types, or of different operational modes. Still other examples may be contemplated by one skilled in the art, but clearly would fall within the scope of the following claims.

What is claimed is:

1. A memory cell, comprising:
   a node operable to present an electrical level representing a first state or a second state;
   a first switching device having a first terminal connected to said node, wherein said first switching device is operable to close thereby connecting the state at the node to a second terminal of said first switching device;
   a second switching device having first and second terminals and operable to switch as a function of the state at said node;
   a third switching device having first and second terminals and operable to switch as a function of the state at said node; and
   a single control switching device associated with said second and third switching devices, wherein a control signal switches said control switching device such that the state at said node is determined by connecting to the first terminals of said second and third switching devices.

2. The memory cell of claim 1 and further comprising a storage element connected to said node.

3. The memory cell of claim 2 wherein said storage element comprises a dynamic random access storage element.

4. The memory cell of claim 2 wherein said storage element comprises a capacitance connected to said first terminal of said first switching device.

5. The memory cell of claim 4 wherein said capacitance comprises a capacitive element.

6. The memory cell of claim 4 wherein said capacitance comprises a parasitic capacitance associated with said second and third switching devices.

7. The memory cell of claim 2 wherein said storage element comprises a static random access storage element.

8. The memory cell of claim 2 wherein said storage element comprises:
a first inverter having an input and an output; and
a second inverter having an input and an output, said input of said second inverter connected to said output of said first inverter and to said node, and said input of said first inverter connected to said output of said second inverter.

9. The memory cell of claim 1 wherein said second switching device comprises a first transistor having a gate, a first source/drain, and a second source/drain, and wherein said third switching devices comprise a second transistor having a gate, a first source/drain, and a second source/drain, wherein said gates of said transistors are connected to said node such that the transistors switch in response to the electrical level at said node.

10. The memory cell of claim 9 wherein said first transistor comprises a p channel transistor and said second transistor comprises an n channel transistor.

11. The memory cell of claim 9 wherein said single control switching device comprises a third transistor having a gate, a first source/drain, and a second source/drain, and wherein the first terminals of said second and third switching devices comprise said first source/drains of said first and second transistors, respectively, and wherein said first source/drain of said third transistor is connected to said second source/drains of said first and second transistors.

12. The memory cell of claim 11 wherein said second source/drain of said third transistor is connected to a reference potential.

13. The memory cell of claim 12 wherein said reference potential comprises a power supply voltage.

14. The memory cell of claim 12 wherein said reference potential comprises ground.

15. The memory cell of claim 9 wherein said single control switching device comprises a third transistor having a gate, a first source/drain, and a second source/drain, and wherein said first terminals of said second and third switching devices comprise said first source/drains of said first and second transistors, respectively, and wherein said first source/drain of said third transistor is connected to said second source/drain of said first transistor and said second source/drain of said third transistor is connected to said second source/drain of said second transistor.

16. The memory cell of claim 1 and further comprising a balancing circuit operable to switch as a function of the state at said node such that the parasitic capacitance of said second and third switching devices are balanced regardless of said state at said node.

17. The memory cell of claim 16 wherein said balancing circuit comprises componentry symmetric to said second and third switching devices.

18. The memory cell of claim 16 wherein said second and third switching devices comprise a p channel transistor and an n channel transistor, respectively, and wherein said balancing circuit comprises a p channel transistor and an n channel transistor.

19. The memory cell of claim 16 wherein said balancing circuit comprises a first transistor having a gate, a first source/drain, and a second source/drain, and a second transistor having a gate, a first source/drain, and a second source/drain, wherein said gates of said transistors are connected to said node such that the transistors switch in response to the electrical level at said node.

20. The memory cell of claim 19 wherein said first source/drain of said first transistor is connected to said first source/drain of said second transistor, and wherein said second source/drain of said first transistor is connected to said first terminal of said second switching device, and wherein said second source/drain of said second transistor is connected to said first terminal of said third switching device.

21. The memory cell of claim 1 wherein said node comprises a first node, and further comprising a second node operable to present an electrical level representing a state opposite the state represented at said first node, wherein said function of operability of said second switching device comprises switching in direct response to said electrical level at said first node and wherein said function of operability of said third switching device comprises switching in direct response to said electrical level at said second node.

22. The memory cell of claim 21 and further comprising a fourth switching device having a first terminal connected to said second node, wherein said fourth switching device is operable to close thereby connecting the state at said second node to a second terminal of said fourth switching device such that said states at said first and second nodes is determined by connecting to the second terminals of said first and fourth switching devices.

23. The memory cell of claim 21 and further comprising a storage element connected between said first and second nodes.

24. The memory cell of claim 23 wherein said storage element comprises a static random access storage element.

25. The memory cell of claim 23 wherein said storage element comprises:
a first inverter having an input and an output; and
a second inverter having an input and an output, said input of said second inverter connected to said output of said first inverter and to said node, and said input of said first inverter connected to said output of said second inverter.

26. The memory cell of claim 21 wherein said second switching device comprises a first transistor having a gate, a first source/drain, and a second source/drain, and wherein said third switching devices comprise a second transistor having a gate, a first source/drain, and a second source/drain, wherein said gate of said first transistor is connected to said first node and wherein said gate of said second transistor is connected to said second node such that said transistors switch in response to the electrical level at said nodes.

27. The memory cell of claim 26 wherein said first and second transistors comprise transistors of the same conductivity type.

28. The memory cell of claim 21 and further comprising a balancing circuit operable to switch as a function of the state at said nodes such that the parasitic capacitance of said second and third switching devices are balanced regardless of said state at said nodes.

29. The memory cell of claim 28 wherein said balancing circuit comprises componentry symmetric to second and third switching devices.

30. The memory cell of claim 28 wherein said second and third switching devices comprise transistors, respectively, and wherein said balancing circuit comprises transistors of the same conductivity type as said transistors of said second and third switching devices.

31. The memory cell of claim 28 wherein said balancing circuit comprises a first transistor having a gate, a first source/drain, and a second source/drain, and a second transistor having a gate, a first source/drain, and a second source/drain, wherein said gate of said first transistor is connected to said first node and said gate of said second transistor is connected to said second node such that said first and second transistors switch in response to the electrical level at said nodes, respectively.

32. The memory cell of claim 21 wherein said second switching device, said third switching device, and said single control switching device together comprise a port circuit, and further comprising a plurality of port circuits, wherein each of said plurality of port circuits comprises:
- a second switching device having first and second terminals and operable to switch as a function of the state at said first node;
- a third switching device having first and second terminals and operable to switch as a function of the state at said second node; and
- a single control switching device associated with said second and third switching devices, wherein a control signal switches said single control switching device such that the state at said nodes is determined by connecting to the first terminals of said second and third switching devices.

33. The memory cell of claim 1 wherein said second switching device, said third switching device, and said single control switching device together comprise a port circuit, and further comprising a plurality of port circuits, wherein each of said plurality of port circuits comprises:
- a second switching device having first and second terminals and operable to switch as a function of the state at said node;
- a third switching device having first and second terminals and operable to switch as a function of the state at said node; and
- a single control switching device associated with said second and third switching devices, wherein a control signal switches said single control switching device such that the state at said node is determined by connecting to the first terminals of said second and third switching devices.

34. A memory cell, comprising:
- a storage element capable of being in a first or second state and having a node for presenting an electrical level representing said first state or second state;
- a first switching device having a first terminal connected to said node, wherein said first switching device is operable to close thereby connecting the state at the node to a second terminal of said first switching device;
- a first transistor having a gate, a first source/drain, and a second source/drain, said gate of said first transistor connected to said node;
- a second transistor having a gate, a first source/drain, and a second source/drain, said second transistor operable to switch as a function of the state at said node, said gate of said second transistor connected to receive a signal which is a function of an electrical level at said node, wherein said second transistor switches as a function of the electrical level at said node; and
- a single control switching device associated with said first and second transistors, wherein a control signal switches said control switching device such that the state at said node is determined by connecting to the first source/drains of said first and second transistors.

35. The memory cell of claim 34 wherein said single control switching device comprises a third transistor having a gate, a first source/drain, and a second source/drain, and wherein said first source/drain of said third transistor is connected to said second source/drains of said first and second transistors and said second source/drain of said third transistor is connected to a reference potential.

36. The memory cell of claim 34 wherein said single control switching device comprises a third transistor having a gate, a first source/drain, and a second source/drain, and wherein said first source/drain of said third transistor is connected to said second source/drain of said first transistor and said second source/drain of said third transistor is connected to said second source/drain of said second transistor.

37. The memory cell of claim 34 and further comprising a balancing circuit operable to switch as a function of the state at said node such that the parasitic capacitance of said first and second transistors are balanced regardless of said state at said node.

38. The memory cell of claim 37 wherein said balancing circuit comprises componentry symmetric to first and second transistors.

39. A memory cell, comprising:
- a node operable to present an electrical level representing a first state or a second state;
- a first switching device having first and second terminals and operable to switch as a function of the state at said node;
- a second switching device having first and second terminals and operable to switch as a function of the state at said node; and
- a first control switching device connected to said first switching device,
- a second control switching device connected to said second switching device, wherein a control signal switches said first and second control switching devices such that said state at said node is determined by connecting to the first terminals of said first and second switching devices.

40. The memory cell of claim 39 wherein said first switching device comprises a p channel transistor and said second switching device comprises an n channel transistor.

41. The memory cell of claim 39 wherein said first and second control switching devices comprise transistors of the same conductivity type.

42. The memory cell of claim 39 wherein said first and second control switching device comprise first and second transistors, and wherein said first and second switching devices comprise third and fourth transistors, each of said transistors comprising a gate, a first source/drain and a second source/drain, and wherein the gates of said first and second transistors are connected to receive a control signal, and wherein said first source/drains of said first and second transistors are connected to said first source/drains of said third and fourth transistors, and wherein said second source/- drains of said first and second transistors may be connected to for determining the state at said node.

43. The memory cell of claim 39 wherein said first and second control switching device comprise first and second transistors, and wherein said first and second switching devices comprise third and fourth transistors, each of said transistors comprising a gate, a first source/drain and a second source/drain, and wherein said first source/drains of said third and fourth transistors are connected to said first source/drains of said first and second transistors, and wherein said second source/drains of said third and fourth transistors are connected to a reference potential.

44. The memory cell of claim 43 wherein said reference potential comprises a supply voltage.

45. The memory cell of claim 43 wherein said reference potential comprises ground.

46. The memory cell of claim 39 wherein said node comprises a first node, and further comprising:
   a second node operable to present an electrical level representing a state opposite the state represented at said first node; and
   a balancing circuit operable to switch as a function of the state at said nodes such that the parasitic capacitance of said first and second switching devices are balanced regardless of said state at said nodes.

47. The memory cell of claim 46 wherein said balancing circuit comprises componentry symmetric to said first and second switching devices.

48. The memory cell of claim 39 wherein said first and second control switching device comprise first and second transistors, respectively, and wherein said first and second switching devices comprise third and fourth transistors, respectively, each of said transistors comprising a gate, a first source/drain and a second source/drain, and wherein the gates of said first and second transistors are connected to receive a control signal, and wherein said gates of said third and fourth transistors are connected to said first node, and wherein said first source/drains of said first and second transistors are connected to said first source/drains of said third and fourth transistors, respectively, and further comprising:
   a second node operable to present an electrical level representing a state opposite the state represented at said first node; and
   a balancing circuit comprising:
      a fifth transistor having a gate connected to said second node, a first source/drain connected to said first source/drains of said first and third transistors; and
      a sixth transistor having a gate connected to said second node, a first source/drain connected to said first source/drains of said second and fourth transistors.

49. A memory cell, comprising:
   a node operable to present an electrical level representing a first state or a second state;
   a port circuit having an output signal representative of the state at said node, said port circuit imposing a capacitance on said node; and
   a balancing circuit coupled to said node and imposing a capacitance on said node for balancing said output signal, said balancing circuit imposed capacitance being such that an equivalent capacitance is imposed on said node irrespective of said state at said node.

50. The memory cell of claim 49 wherein said node comprises a first node, and wherein said port circuit comprises a first and second transistor, each having a gate, said gate of said first transistor connected to said first node and said gate of said second transistor connected to a second node having an electrical level opposite said first node, said first and second transistors of the same conductivity type.

51. The memory cell of claim 50 wherein said balancing circuit comprises a third and fourth transistor, each having a gate, said gate of said third transistor connected to said first node and said gate of said fourth transistor connected to said second node, said third and fourth transistors of the same conductivity type as said first and second transistors.

52. The memory cell of claim 51 wherein each of said first, second, third and fourth transistors comprise a first source/drain, and wherein said first source/drain of said first transistor is connected to said first source/drain of said fourth transistor, and wherein said first source/drain of said second transistor is connected to said first source/drain of said third transistor.

53. The memory cell of claim 52 wherein each of said first, second, third and fourth transistors comprise a second source/drain, and wherein said second source/drain of said first transistor is connected to said second source/drain of said second transistor, and wherein said second source/drain of said third transistor is connected to said second source/drain of said fourth transistor.

54. A method of determining the state at a node, comprising the steps of:
   activating a first and second switching device in response to the state at a node, each of said switching devices having a first and second terminal;
   activating a single control switching device associated with the first terminals of the first and second switching devices; and
   connecting to the second terminals of the first and second switching devices in order to determine the state at the node.

55. The method of claim 54 wherein said step of connecting comprises sensing the potential to determine the relative potential between the second terminals of the first and second switching devices.

56. The method of claim 54 wherein said step of connecting comprises sensing the impedance between the second terminals to determine whether there is a high or low impedance therebetween.

57. The method of claim 54 wherein said step of activating a single control switching device comprises activating a transistor having a gate, a first source/drain, and a second source/drain, wherein said first source/drain of said transistor is connected to the first terminals of said first and second switching devices.

58. The method of claim 54 wherein said step of activating a single control switching device comprises activating a transistor having a gate, a first source/drain, and a second source/drain, wherein said first source/drain of said transistor is connected to the first terminal of said first switching device and wherein said second source/drain of said transistor is connected to the first terminal of said second switching device.

59. A system, comprising:
   a graphics processor; and
   a video memory coupled to said graphics processor, wherein said video memory comprises a plurality of memory cells, wherein each memory cell comprises:
      a node operable to present an electrical level representing a first state or a second state;

a first switching device having a first terminal connected to said node, wherein said first switching device is operable to close thereby connecting the state at the node to a second terminal of said first switching device;

a second switching device having first and second terminals and operable to switch as a function of the state at said node;

a third switching device having first and second terminals and operable to switch as a function of the state at said node; and a single control switching device associated with said second and third switching devices, wherein a control signal switches said control switching device such that the state at said node is determined by connecting to the first terminals of said second and third switching devices.

60. A system comprising:

a graphics processor; and a video memory coupled to said graphics processor, wherein said video memory comprises a plurality of memory cells, wherein each memory cell comprises:

a storage element capable of being in a first or second state and having a node for presenting an electrical level representing said first state or second state;

a first switching device having a first terminal connected to said node, wherein said first switching device is operable to close thereby connecting the state at the node to a second terminal of said first switching device;

a first transistor having a gate, a first source/drain, and a second source/drain, said gate of said first transistor connected to said node;

a second transistor having a gate, a first source/drain, and a second source/drain, said second transistor operable to switch as a function of the state at said node, said gate of said second transistor connected to receive a signal which is a function of an electrical level at said node, wherein said second transistor switches as a function of the electrical level at said node; and a single control switching device associated with said first and second transistors, wherein a control signal switches said control switching device such that the state at said node is determined by connecting to the first source/drains of said first and second transistors.

61. A system, comprising:

a graphics processor; and a video memory coupled to said graphics processor, wherein said video memory comprises a plurality of memory cells, wherein each memory cell comprises:

a node operable to present an electrical level representing a first state or a second state;

a port circuit having an output signal representative of the state at said node, said port circuit imposing a capacitance on said node; and a balancing circuit coupled to said node and imposing a capacitance on said node for balancing said output signal, such that an equivalent capacitance is imposed on said node irrespective of said state at said node.

* * * * *